United States Patent [19]

Narahashi et al.

[11] Patent Number: 5,166,634
[45] Date of Patent: Nov. 24, 1992

[54] FEED-FORWARD AMPLIFIER

[75] Inventors: Shoichi Narahashi, Yokohama; Toshio Nojima; Makoto Maeta, both of Yokosuka; Kazuaki Murota, Yokohama, all of Japan

[73] Assignee: Nippon Telegraph and Telephone Corporation, Tokyo, Japan

[21] Appl. No.: 727,987

[22] Filed: Jul. 10, 1991

[30] Foreign Application Priority Data

| Jul. 11, 1990 | [JP] | Japan | 2-182988 |
| Jul. 25, 1990 | [JP] | Japan | 2-198699 |
| Jul. 25, 1990 | [JP] | Japan | 2-198700 |
| Dec. 28, 1990 | [JP] | Japan | 2-409030 |
| Dec. 28, 1990 | [JP] | Japan | 2-409031 |
| Mar. 14, 1991 | [JP] | Japan | 3-49688 |

[51] Int. Cl.$^5$ .............................................. H03F 1/32
[52] U.S. Cl. .................................... 330/151; 350/52
[58] Field of Search .................... 330/52, 149, 151; 328/163

[56] References Cited

U.S. PATENT DOCUMENTS 3,922,617 11/1975 Denniston et al. ............... 330/151 X
4,885,551 12/1989 Myer .............................. 330/151 X

OTHER PUBLICATIONS

"A Microwave Feed-Forward Experiment" by H. Seidel, Bell System Technical Journal, vol. 50, No. 9, pp. 2879-2916, Nov. 1971.

Primary Examiner—James B. Mullins
Attorney, Agent, or Firm—Pollock, Vande Sande and Priddy

[57] ABSTRACT

In a feed-forward amplifier which has an error detection circuit for detecting a nonlinear distortion component of a main amplifier and an error rejection circuit for amplifying the detected distortion component by an auxiliary amplifier and injecting it into the main amplifier to cancel an error component, a first pilot signal is injected into a signal input path and a second pilot signal is injected into a signal amplification path of the error detection circuit. A first variable attenuator and a first variable phase shifter of the error detection circuit are adjusted by a control circuit so that the level of the first pilot signal component on an error injection path of the error rejection circuit decreases to minimum. A second variable attenuator and a second variable phase shifter of the error rejection circuit are adjusted by the control circuit so that the level of the second pilot signal component on a signal output path decreases to a minimum. The first pilot signal component which appears on the signal output path is rejected by a filter or cancelled by supplying the error injection path or signal output path with the first pilot signal after adjusting its amplitude and phase. Alternatively, the frequency of the first pilot signal to be injected into the signal input path is spread to lower the level of the first pilot signal per unit spectrum which appears on the signal output path.

34 Claims, 15 Drawing Sheets

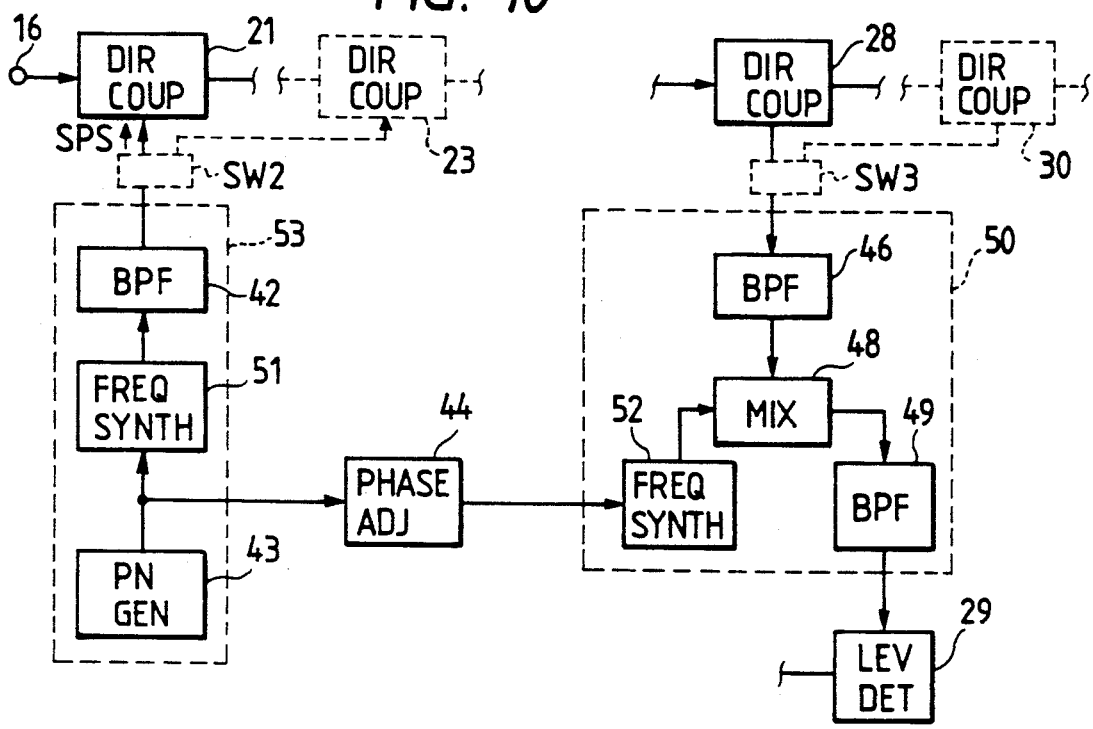
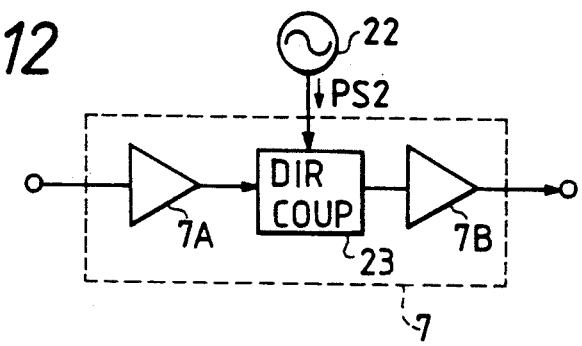
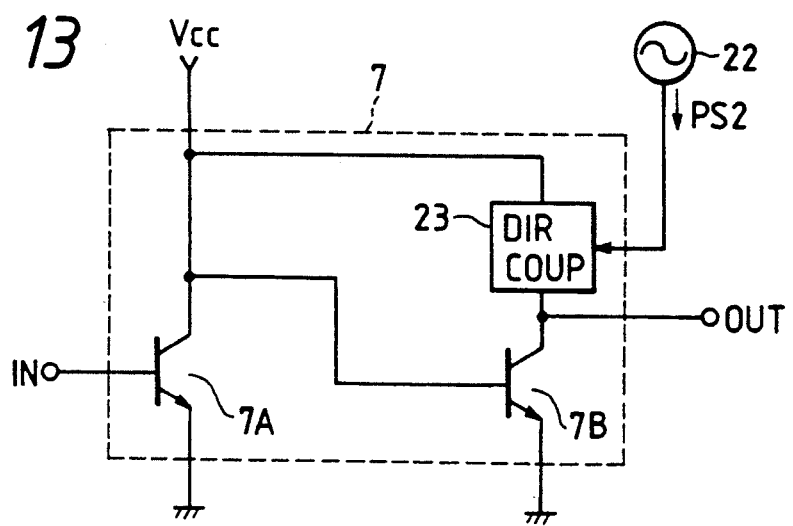

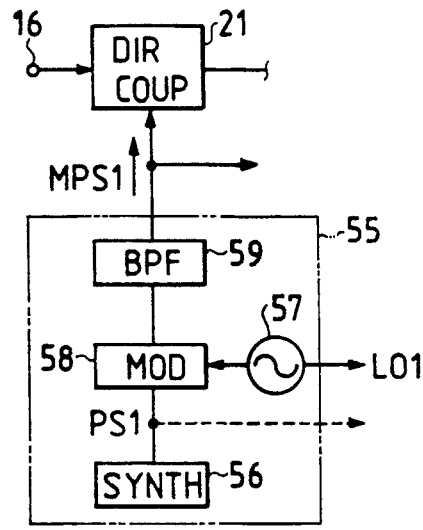
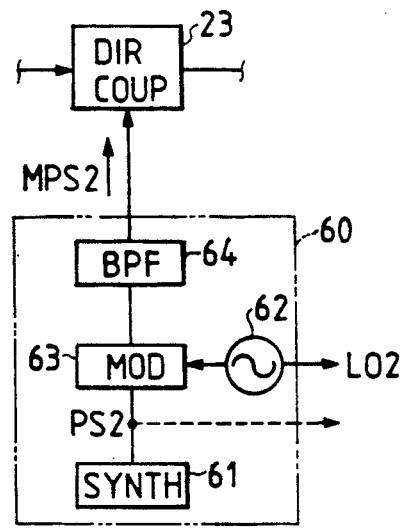
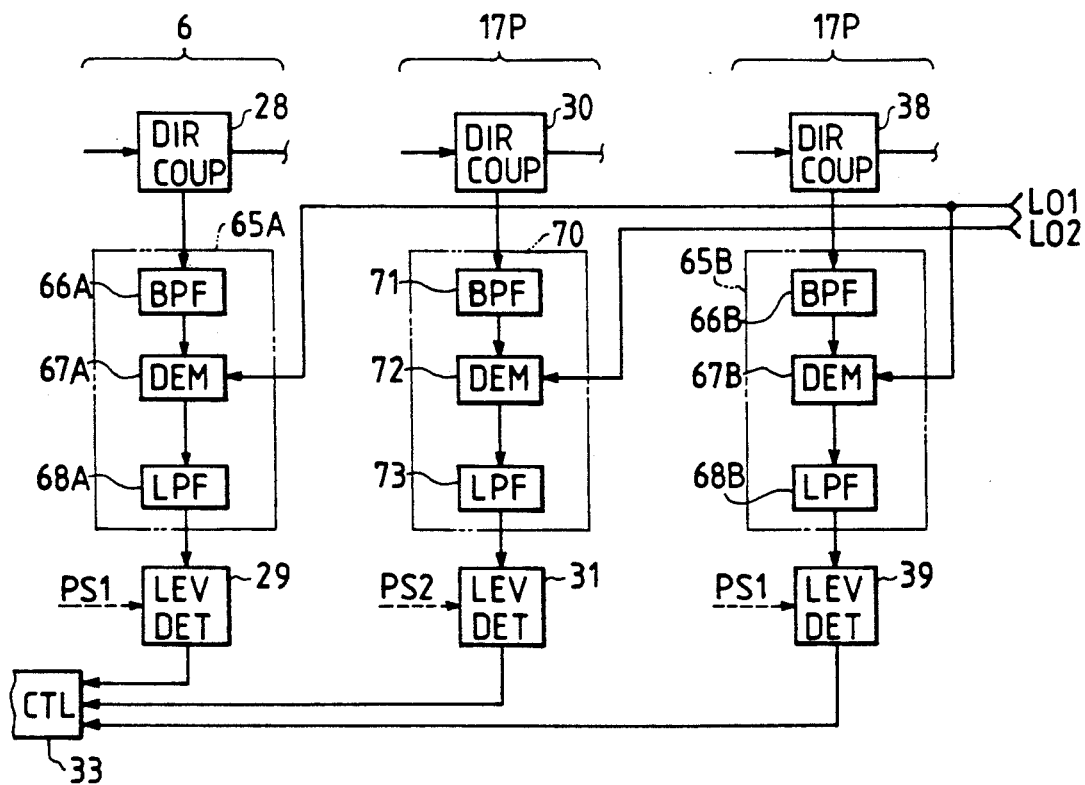

FEED-FORWARD AMPLIFIER

BACKGROUND OF THE INVENTION

The present invention relates to a linear amplifier for use mainly in the high frequency band and, more particularly, to a feed-forward amplifier which includes an error detection circuit which detects a nonlinear distortion component of a main amplifier and an error rejection circuit which amplifies the detected distortion component by use of an auxiliary amplifier and then injects it into the output of the main amplifier to thereby cancel the error component.

FIG. 1 shows the basic construction of a conventional feed-forward amplifier. The feed-forward amplifier is comprised basically of two signal cancellation circuits, i.e. an error detection circuit 1 and an error rejection circuit 2. The error detection circuit 1 includes a signal amplification path 3 and a linear signal path 4, and the error rejection circuit 2 includes a linear signal path 5 and an error injection path 6. The signal amplification path 3 is formed by a cascade connection of a main amplifier 7, a variable attenuator 8 and a variable delay line or phase shifter 9, whereas the linear signal path 4 is formed by a transmission line. The linear signal path 5 is formed by a transmission line, whereas the error injection path 6 is formed by a cascade connection of a variable attenuator 10, a variable delay line 11 and an auxiliary amplifier 12. Even if both or either one of the variable attenuator 8 and the variable delay line 9 is provided in the linear signal path 4, there would be no appreciable characteristic difference. Similarly, both or either one of the variable attenuator 10 and the variable delay line 11 may also be included in the linear signal path 5. A power divider 13, a power combiner/divider 14 and a power combiner 15 are each a simple loss-free power divider/combiner composed of a transformer or a hybrid circuit. A description will be given of the operation of the feed-forward amplifier.

An input signal to an input terminal 16 is divided first by the power divider 13 to the paths 3 and 4 and then the divided signals are combined by the power combiner/divider 14. The variable attenuator 8 and the variable delay line 9 are adjusted so that the two signal components divided from the respective paths 3 and 4 to the error injection path 6 via the power combiner/divider 14 are equal in amplitude and delay but anti-phase relative to each other. In this instance, the condition for the anti-phase relationship can be implemented by a proper selection of the phase shift amount between input and output ports of the power divider 13 or power combiner/divider 14, or by a phase inversion in the main amplifier 7, or by inserting a phase inversion circuit having a short-circuit termination at one terminal of a circulator 18, such as depicted in FIG. 2, in either one of the paths 3 and 4. Since the error detection circuit 1 is constructed as mentioned above, a difference component between the two signals on the two paths 3 and 4 is detected as the output from the power combiner/divider 14 to the path 6. This difference component is exactly the error comprised of signal distortion and noise which are produced by the main amplifier 7 itself; therefore, the circuit 1 is called an error detection circuit.

The variable attenuator 10 and the variable delay line 11 are adjusted so that transfer functions of the two paths 5 and 6 from an input port 14a of the power combiner/divider 14, which is the output terminal of the path 3, to an output terminal 17 of the power combiner 15 are equal in terms of amplitude and delay but bear an anti-phase relationship to each other. Since the input signal to the path 6 is the error component of the main amplifier 7 detected by the error detection circuit 1, the path 6 injects the error component into the output signal of the main amplifier 7 in anti-phase and equal amplitude relationships thereto at the output terminal 17 of the power combiner 15, and as a result of this, the error component in the output of the entire feed-forward amplifier circuit is cancelled.

The above is the operation of an ideal feed-forward amplifier, but it is difficult, in practice, to completely adjust the two paths in each of the error detection circuit 1 and the error rejection circuit 2 so that they bear the above-mentioned anti-phase and equal amplitude relationship to each other. Even if the initial adjustment were perfect, characteristics of the amplifiers used would vary with variations in the ambient temperature, the power supply voltage, etc.; so that it is extremely difficult to maintain the equilibrium of the two paths for a long period of time. FIG. 3 is a graph showing the relationship between deviations of the amplitude and phase of two signal components on the two paths of each of the circuits 1 and 2 from their equal amplitude and anti-phase requirements and the amount of signal suppression. It is seen from FIG. 3 that deviations of the phase and amplitude need to be within ±1.8 degrees and within ±0.3 dB, respectively, for example, and that severe limitations are imposed on the equilibrium of transmission characteristics of the two paths and completeness of their adjustment therefor. When the equilibrium or balance of the error detection circuit 1 is lost by a change in the ambient temperature, a voltage fluctuation of the power supply, or long term fluctuation of characteristics of circuit elements, a component of the main signal (i.e. the input signal component to the input terminal 16) is added to the input to the auxiliary amplifier 12 at a level higher than the error component, generating an unnecessary distortion. When the balance of the error rejection circuit 2 is lost, the amount of signal suppression is reduced and the amount of distortion improvement as by the feed-forward amplifier is deteriorated accordingly.

U.S. Pat. No. 4,580,105 discloses an arrangement in which a pilot signal is injected via a coupler into the signal amplification path 3 of the main amplifier 7 at the input side thereof in the feed-forward amplifier of FIG. 1 and the variable attenuator 10 and the variable delay line 11 are automatically controlled in such a manner as to minimize the level of the pilot signal component which is detected in the output of the feed-forward amplifier. With such automatic control, it is possible to retain the equilibrium in the error rejection circuit 2 but impossible to maintain the equilibrium in the error detection circuit 1. Consequently, the equilibrium of the error detection circuit 1 is destroyed with the lapse of time, resulting in the amount of distortion improvement as by the feed-forward amplifier being reduced correspondingly.

Japanese Patent Application Laid Open No. 198,809/1989 discloses an arrangement in which a pilot signal is injected via a coupler into the signal input path between the input terminal 16 and the power divider 13 in the feed-forward amplifier of FIG. 1, and the variable attenuator 8 and the variable delay line 9 of the error detection circuit 1 are automatically controlled in such a manner as to minimize the level of the pilot signal component which appears in the output from the auxiliary amplifier 12 of the error rejection circuit 2. In the case where the pilot signal is injected into the signal amplification path 3 as set forth in the above-noted U.S. patent, substantially no pilot signal component is provided at the output terminal 17 of the feed-forward amplifier, whereas when the pilot signal is injected into the input side of the feed-forward amplifier as described in the above-mentioned Japanese application, an amplified pilot signal is provided at the output terminal 17. Accordingly, during control of the balance of the error detection circuit 1 the feed-forward amplifier cannot be used for signal amplification.

SUMMARY OF THE INVENTION

It is therefore an object of the present invention to provide a feed-forward amplifier which is automatically adjustable for equilibrium by use of a pilot signal and which substantially precludes the possibility of the pilot signal component appearing in its output and hence permits the adjustment for equilibrium even during the signal amplifying operation and retains the equilibrium state for a long period of time.

In the feed-forward amplifier of the present invention, which is of the type including an error detection circuit for detecting an error including nonlinear distortion components and noises produced by a main amplifier and an error rejection circuit for cancelling the detected error component by injecting it again into the output of the main amplifier after amplifying it by use of an auxiliary amplifier, first pilot injection means for injecting a first pilot signal is provided in the signal input path of the feed-forward amplifier, and first electrically variable attenuation means and first electrically variable phase shift means are inserted in the error detection circuit. Second pilot injection means for injecting a second pilot signal is provided in the path of the main amplifier, and second electrically variable attenuation means and second electrically variable phase shift means are inserted in the error rejection circuit. A first level detection means for detecting the level of the first pilot signal is provided in association with the path of the auxiliary amplifier, and second level detection means for detecting the level of the second pilot signal is provided in association with the signal output path of the feed-forward amplifier unit. Moreover, means is provided for removing the first pilot signal component in the signal output path of the feed-forward amplifier. The first electrically variable attenuation means and the first electrically variable phase shift means are controlled by controlling means so that the level detected by the first level detection means is minimized, and the second electrically variable attenuation means and the second electrically variable phase shift means are controlled by the control means so that the level detected by the second level detection means is minimized.

BRIEF DESCRIPTION OF THE DRAWINGS

FIG. 10 is a block diagram showing the principal part of a modified form of the FIG. 9 embodiment;

FIG. 12 is a block diagram illustrating an example of a main amplifier in the FIG. 9 embodiment;

FIG. 13 is a block diagram illustrating another example of the main amplifier in the FIG. 9 embodiment;

FIG. 18A is a block diagram illustrating an example of the construction of a first pilot signal generator 55 for use in the case of employing a modulated pilot signal in FIG. 6 or 7;

FIG. 18B is a block diagram illustrating an example of the construction of a second pilot signal generator 60 for generating a modulated second pilot signal;

FIG. 18C is a block diagram illustrating, by way of example, demodulators 65A, 65B and 70 for use in the case of employing the modulated pilot signals;

DESCRIPTION OF THE PREFERRED EMBODIMENTS

Figure 1:
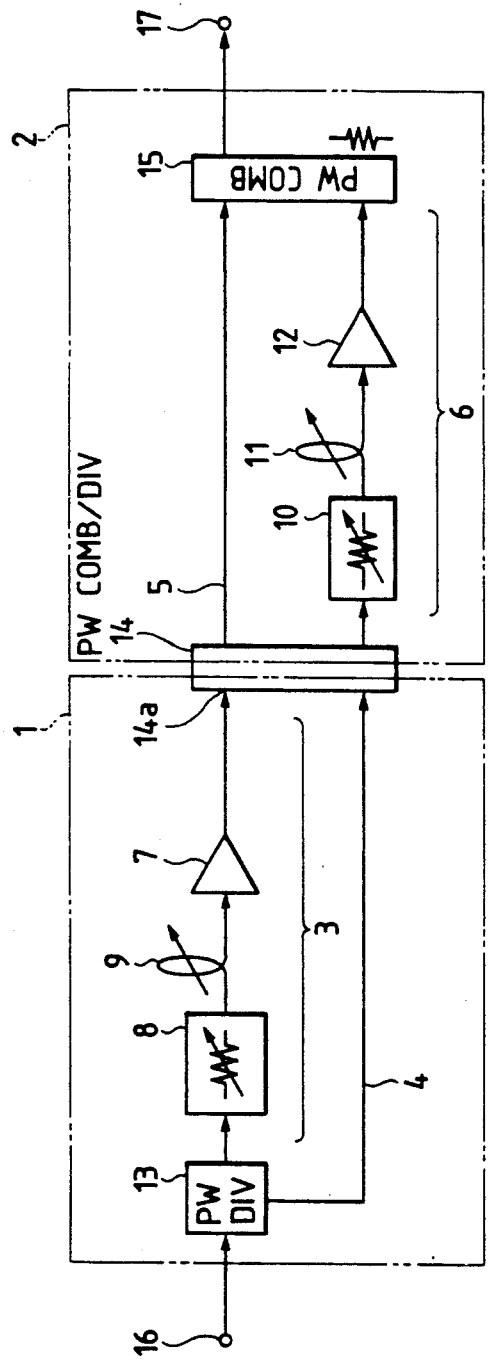
FIG. 1 is a block diagram for explaining the principles of a conventional feed-forward amplifier.
Figure 2:
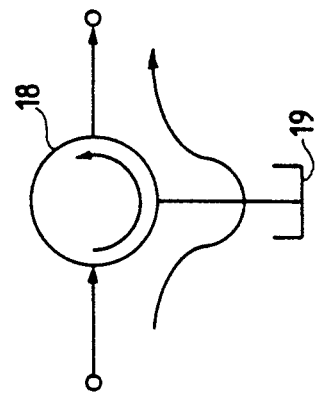
FIG. 2 is a diagram showing a circulator for implementing phase inversion means.
Figure 3:
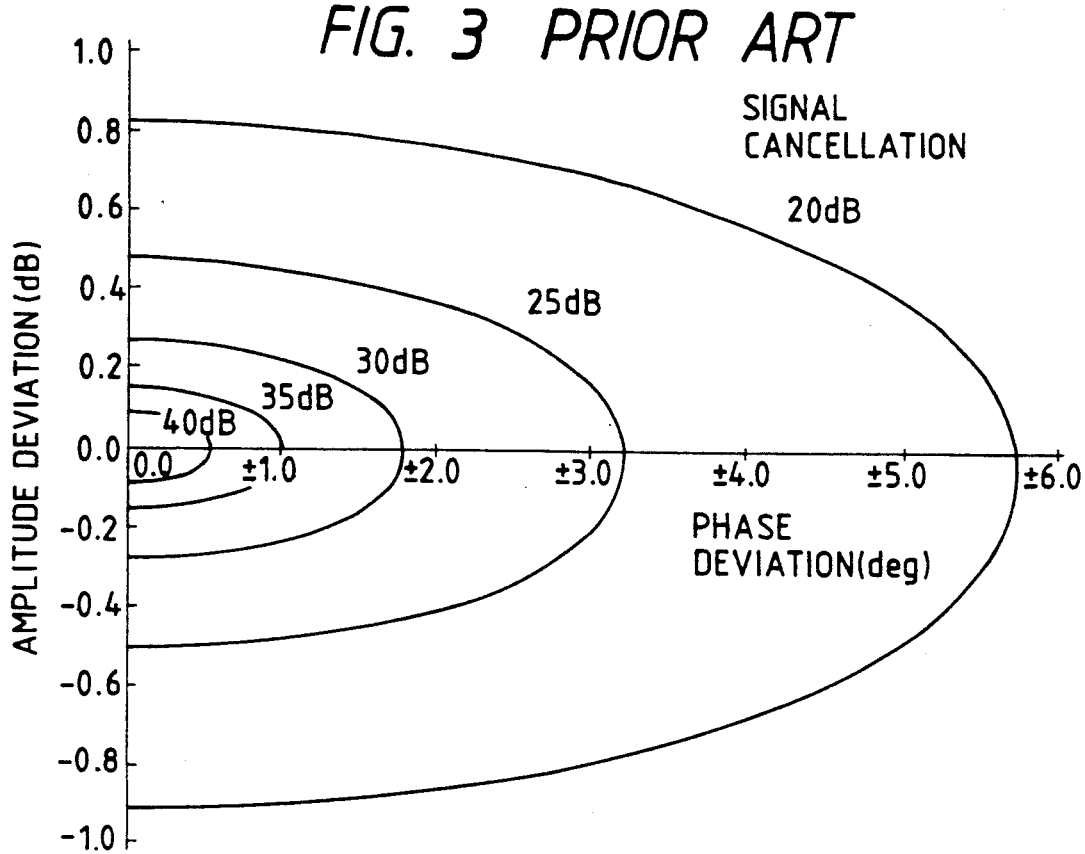
FIG. 3 is a graph showing the relationship between deviations in amplitude and phase from their equilibrium state in a circuit 1 or 2 in FIG. 1 and the amount of signal suppression.
Figure 4:
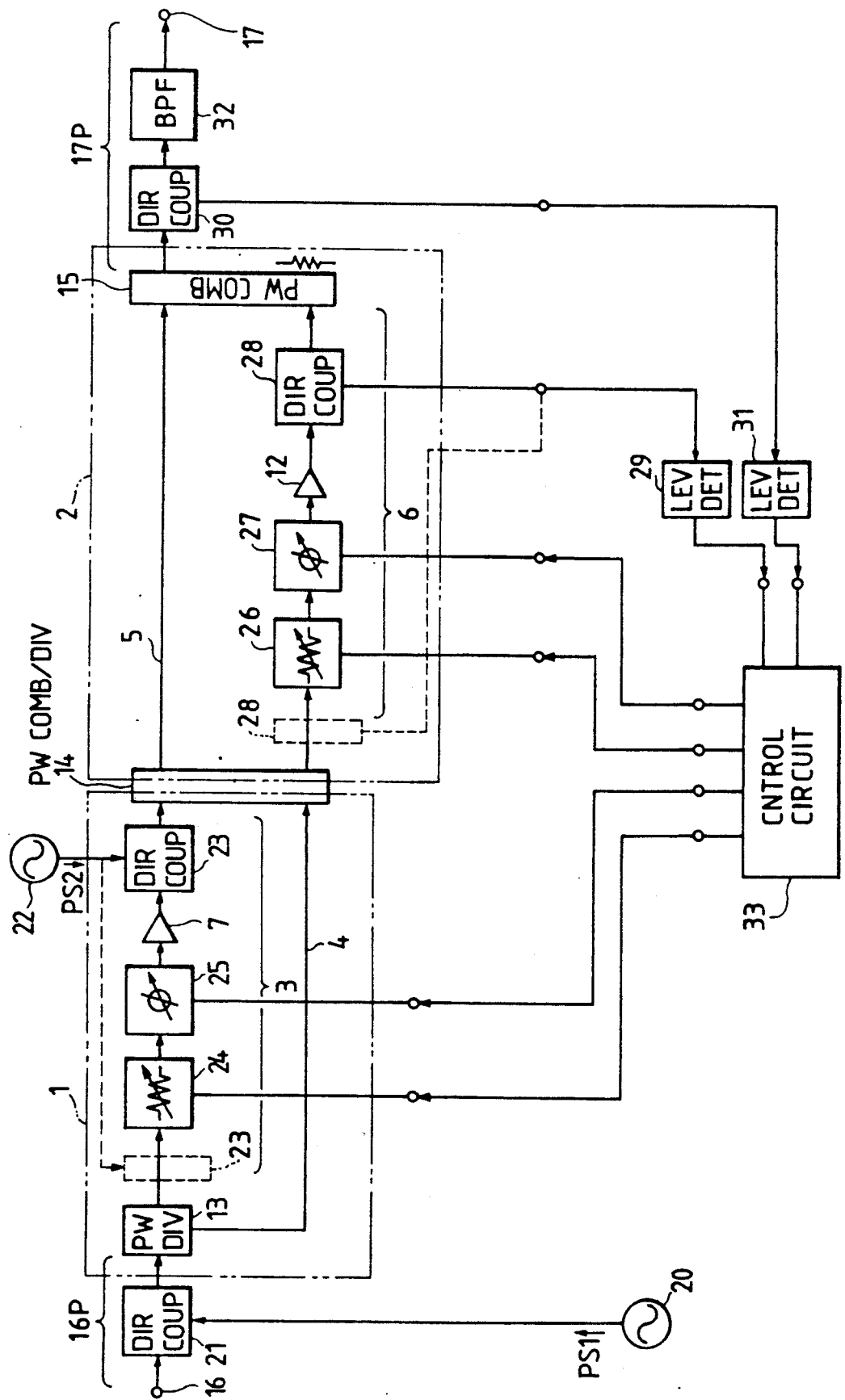
FIG. 4 is a block diagram illustrating an embodiment of the present invention.

With reference to the accompanying drawings, embodiments of the present invention will hereinafter be described in detail. FIG. 4 illustrates in block form an embodiment of the present invention, in which the parts corresponding to those in FIG. 1 are identified by the same reference numerals. A directional coupler 21 is inserted in a signal input path 16P from the input terminal 16 to the power divider 13. An oscillator 20, e.g., a frequency synthesizer, for generating a first pilot signal PS1 of a specified frequency, is connected via the directional coupler 21 to the signal input path 16P. An oscillator 22, e.g., a frequency synthesizer, for generating a second pilot signal PS2 of a specified frequency, is similarly connected via a directional coupler 23 to the output side of the main amplifier 7. Inserted in the signal amplification path 3 of the error detection circuit 1 are variable attenuator 24 and a variable phase shifter 25 both of which are electrically adjustable. Likewise, a variable attenuator 26 and variable phase shifter 27, both of which are electrically adjustable, are inserted in the error injection path 6 of the error rejection circuit 2. The variable attenuators 24, 26 and the variable phase shifters 25, 27 can easily be constructed using PIN diodes and varactor diodes, respectively, and may also be commercially available.

A level detector 29 for detecting the level of the first pilot signal PS1 is connected via a directional coupler 28 to the error injection path 6 at the output side of the auxiliary amplifier 12. A level detector 31 for detecting the level of the second pilot signal PS2 is connected via a directional coupler 30 to a signal output path 17P of the feed-forward amplifier from the power combiner 15 to the output terminal 17. Furthermore, a band-pass filter (BPF) 32 for rejecting the first pilot signal component is inserted in the signal output path 17P. The outputs of the level detectors 29 and 31 are applied to a control circuit 33, which controls the variable attenuators 24 and 26 and the variable phase shifters 25 and 27. Each of the level detectors 29 and 31 may be formed, for example, as a known selective level meter composed of a frequency converter, a narrow-band filter and a detector, or by a known homodyne detection circuit as described later on. The control circuit 33 comprises an A/D converter, a microprocessor and a D/A converter as basic circuit elements, though not shown, and possesses a function of controlling the set points of the variable attenuators 24, 26 and the variable phase shifters 25, 27 while monitoring the output signals from the level detectors 29 and 31. Now, the control operation of the control circuit 33 will be described.

The first pilot signal PS1 provided by the oscillator 20 is set to a frequency a little apart from the frequency band of the input signal to the feed-forward amplifier. The second pilot signal PS2 provided by the oscillator 22 may be set to a frequency within the frequency band of the signal to be amplified, or an out-of-band frequency different from that of the first pilot signal. The bandpass filter 32 is set to have a pass band which permits the passage therethrough of the input signal and its neighboring bands but inhibits the passage therethrough of the first pilot signal PS1.

Figure 5:
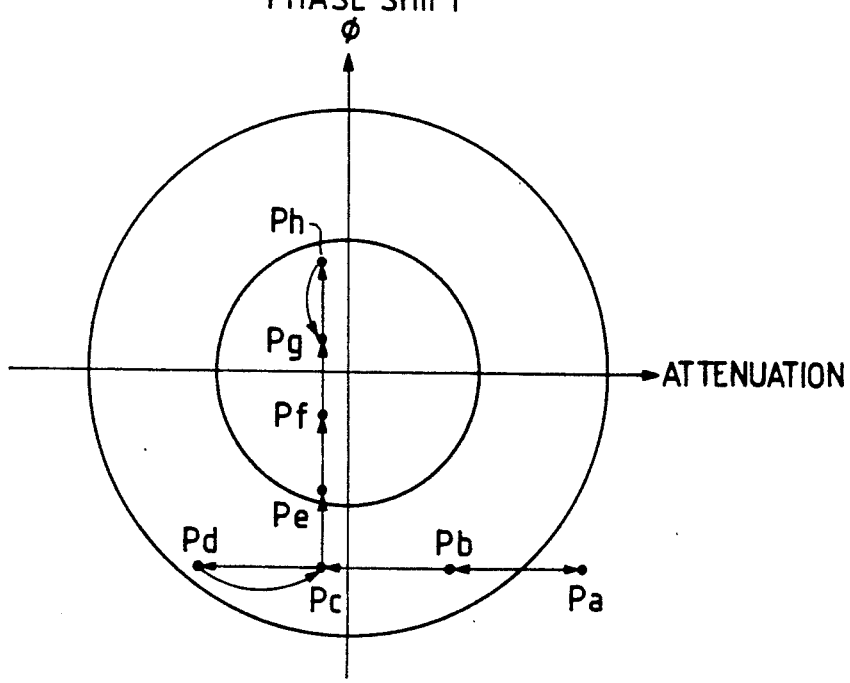
FIG. 5 is a diagram for explaining amplitude and phase control procedures.

The control circuit 33 adjusts the set points of the variable attenuator 24 and the variable phase shifter 25 in a manner to reduce the output of the level detector 29 to a minimum. This can be achieved by a method in which, for example, the set points are varied little by little on a stepwise basis until the output of the level detector 29 becomes minimum and thereafter the control voltage for each of the variable attenuator 24 and the variable phase shifter 25 corresponding to the minimum output of the detector 29 is maintained. FIG. 5 shows an example of this adjustment.

In FIG. 5, the adjustment starts with slightly perturbing the attenuation on the signal amplification path 3 by the variable attenuator 24 from a point Pa to Pb. Upon each decrease in the detected pilot signal level, the amplitude is perturbed from the point Pb to Pc. When the amplitude is perturbed from the point Pc to Pd, the detected pilot signal level rises; so that the direction of perturbation is reversed and the amplitude is returned to the point Pc. The point Pc is regarded as a temporary minimal point of the amplitude. Next, similar control of the phase shift amount $\phi$ is started at the point Pc and a temporary minimal point Pg of phase is reached. After the temporary minimal points of amplitude and phase are thus determined, similar processing is repeated using a smaller amount of perturbation, by which new temporary minimal points are obtained. Thus, upon each reduction of the width of perturbation, temporary minimal points of amplitude and phase are determined. The set points of amplitude and phase at the time points when values of their temporary minimal points become smaller than predetermined values are defined as optimum operation points (i.e. the balanced state), and the variable attenuator 24 and the variable phase shifter 25 are held at the set points.

The directions of perturbation of amplitude and phase perpendicularly cross each other, the perturbation of one of them does not affect the adjustment point of the other and the temporary minimal points converge on a single point; so that it is also a feature of the feed-forward amplifier that a balance adjustment control can be effected stably. By using a signal of a specified frequency, that is, the first pilot signal PS1 as mentioned above, the transmission characteristics of the two paths 3 and 4, which form the error detection circuit 1, can easily be made equal in amplitude but anti-phase relative to each other, independently of the input signal. By this, it is possible to obtain the condition for minimizing the output of the auxiliary amplifier 12, that is, the state in which the amount of signal suppression by the error detection circuit 1, viewed from the error injection path 6, becomes maximum.

Next, the control circuit 33 adjusts the set points of the electrically variable attenuator 26 and the electrically variable phase shifter 27 so that the output level of the level detector 31 takes a minimum value. Since the injection of the second pilot signal PS2 from the oscillator 22 into the signal amplification path 3 is equivalent to the generation of an error of the same component as that of the second pilot signal PS2 by the main amplifier 7, it is possible to obtain the condition for minimizing the error component contained in the output signal, that is, the state in which the amount of distortion suppression by the error rejection circuit 2 becomes maximum as viewed from the output terminal 17, by adjusting the variable attenuator 26 and the variable phase shifter 27 so that the level of the second pilot signal PS2 detected by the level detector 31 is reduced to a minimum. The first pilot signal PS1 from the oscillator 20 is rejected by the band-pass filter 32, and hence does not appear at the output terminal 17. When the frequency of the first pilot signal PS1 is selected higher than the band of the input signal, a low-pass filter (LPF) can be used as the band-pass filter 32, whereas when the frequency of the first pilot signal PS1 is selected lower than the band of the input signal, a high-pass filter can also be employed. For example, a receiver in a base station of a mobile radio communication system simultaneously receives signals of predetermined different frequencies from a plurality of mobile stations. In the case of employing the feed-forward amplifier of the present invention in such a receiver, it is possible to set the first pilot signal PS1 to a frequency in a gap between adjacent signal frequencies within the receiving frequency band and to substitute the band-pass filter 32 with a narrow-band filter such as a notch filter, for inhibiting the passage therethrough of the first pilot signal PS1. On the other hand, the second pilot signal PS2 can be regarded as an error generated by the main amplifier 7, and hence it is suppressed by the error rejection circuit 2 regardless of its frequency. Accordingly, the frequency of the second pilot signal PS2 can be chosen arbitrarily, as long as it differs from the frequency of the first pilot signal PS1.

By effecting the above two control operations at all times or intermittently, it is possible to implement a feed-forward amplifier which is always held in its optimum operating condition and is excellent in linearity. As indicated by the broken lines in FIG. 4, the directional coupler 28 may also be connected to the input side of the auxiliary amplifier 12 and the directional coupler 23 may also be connected to the input side of the main amplifier 7. This applies to embodiments of the invention described below.

Figure 6:
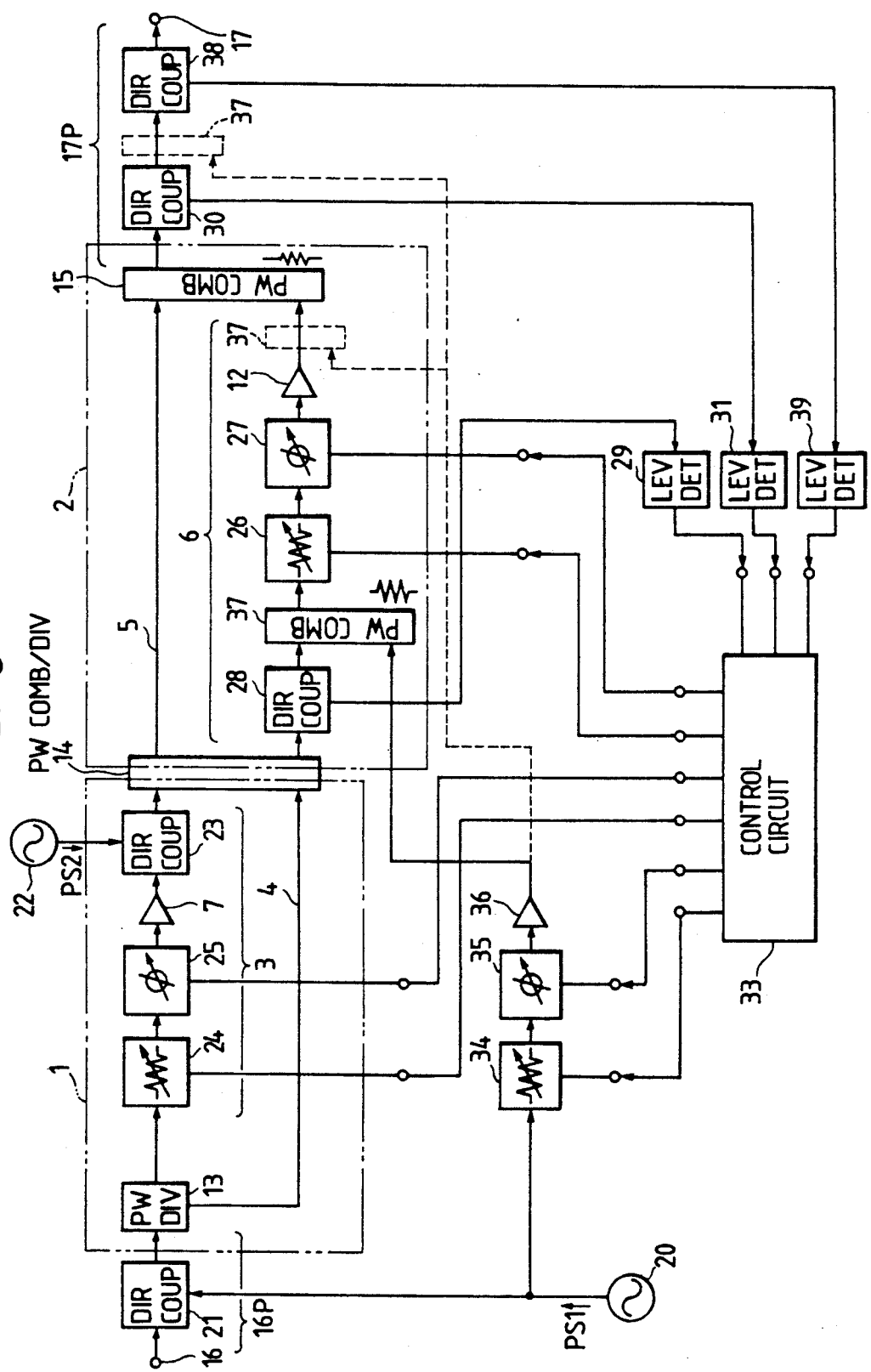
FIG. 6 is a block diagram illustrating another embodiment of the present invention.

The embodiment of FIG. 4 has been described with respect to the case where the filter 32 is inserted in the signal output path 17P of the feed-forward amplifier unit for the purpose of removing the first pilot signal PS1. If the frequency of the first pilot signal PS1 is chosen outside the band of the input signal, then the remaining or residual pilot signal can be eliminated relatively easily. In practice, however, the amplitude and phase characteristics of the error detection circuit 1 and the error rejection circuit 2 in the frequency band of the input signal usually somewhat differ from amplitude and phase characteristics of the first pilot signal PS1 at its frequency outside the frequency band of the input signal, and the difference is variable with time and ambient temperature. Accordingly, even if the balance adjustment (i.e. the suppression of signal component) of the error detection circuit 1 is carried out using the first pilot signal PS1, the balance of the circuit 1 for the input signal band is not always achieved with high accuracy. FIG. 6 illustrates another embodiment of the invention which is adapted to prevent the first pilot signal component from being contained in the output, even if the frequency of the first pilot signal PS1 is selected within the frequency band of the input signal.

In the FIG. 6 embodiment, the error detection circuit 1 is identical with that shown in FIG. 4 and the error rejection circuit 2 has an arrangement in which the directional coupler 28 is provided at the position indicated by the broken line in FIG. 4. This embodiment includes a power combiner 37 inserted in the error injection path 6 at the output side of the directional coupler 28. The power combiner 37 is supplied with the first pilot signal PS1 from the output of the oscillator 20 via a variable attenuator 34, a variable phase shifter 35 and an amplifier 36. The first pilot signal PS1 is controlled by the power combiner 37 in amplitude and phase and is injected therethrough into the error injection path 6. In the signal output path 17P of the feed-forward amplifier unit there is inserted a directional coupler 38 in addition to directional coupler 30 for extracting the second pilot signal PS2. The directional coupler 38 is connected to a level detector 39, by which the level of the first pilot signal component is detected.

The control circuit 33 controls first the variable attenuator 24 and the variable phase shifter 25 so that the level of the first pilot signal PS1 detected by the level detector 39 may be reduced to a minimum. By this, the transmission characteristics of the signal amplification path 3 and the linear signal path 4 in the error detection circuit 1 are caused to bear the equal amplitude and anti-phase relationship to each other. Next, the transmission characteristics of the linear signal path 5 and the error injection path 6 in the error rejection circuit 2 are made equal-amplitude and anti-phase relative to each other, by controlling the variable attenuator 26 and the variable phase shifter 27 so that the level of the second pilot signal PS2 detected by the level detector 31 may be reduced to a minimum. Following this, the control circuit 33 controls the variable attenuator 34 and the variable phase shifter 35 in such a manner as to minimize the level of the first pilot signal component which is detected by the level detector 39. In the FIG. 4 embodiment the first pilot signal PS1 input into the feed-forward amplifier via the directional coupler 21 is amplified by the main amplifier 7 and almost all of its power is provided to the signal output path 17P via the linear signal path 5; so that the first pilot signal component is rejected by the band-pass filter 32. In the FIG. 6 embodiment, however, a first pilot signal, which bears the equal-amplitude and anti-phase relationship to the first pilot signal which is provided to the signal output path 17P from the linear signal path 5, is provided to the signal output path 17P from the error injection path 6, whereby the first pilot signals can be cancel each other.

In the embodiment of FIG. 6, the power combiner 37 may be disposed anywhere at the output side (i.e. downstream) of the directional coupler 28 so that no influence will be exerted on the detection of the level of the first pilot signal by the level detector 29 during the adjustment of the variable attenuator 24 and the variable phase shifter 25. For example, it may be disposed at the output side of the auxiliary amplifier 12 (in which case the gain of the amplifier 36 must be increased) as indicated by the broken line, or it may also be provided at a desired position on the signal output path 17P at the input side of the directional coupler 38 (in which case, too, the gain of the amplifier 36 must be increased). Moreover, the power combiner 37 can be disposed at the input side of the directional coupler 28 in the case where a switch SW1 is connected in series at a desired position in the signal path from the oscillator 20 to the power combiner 37 via the variable attenuator 34, the variable phase shifter 35 and the amplifier 36 and is turned ON by the control circuit 33 as shown in FIG. 7.

Figure 7:
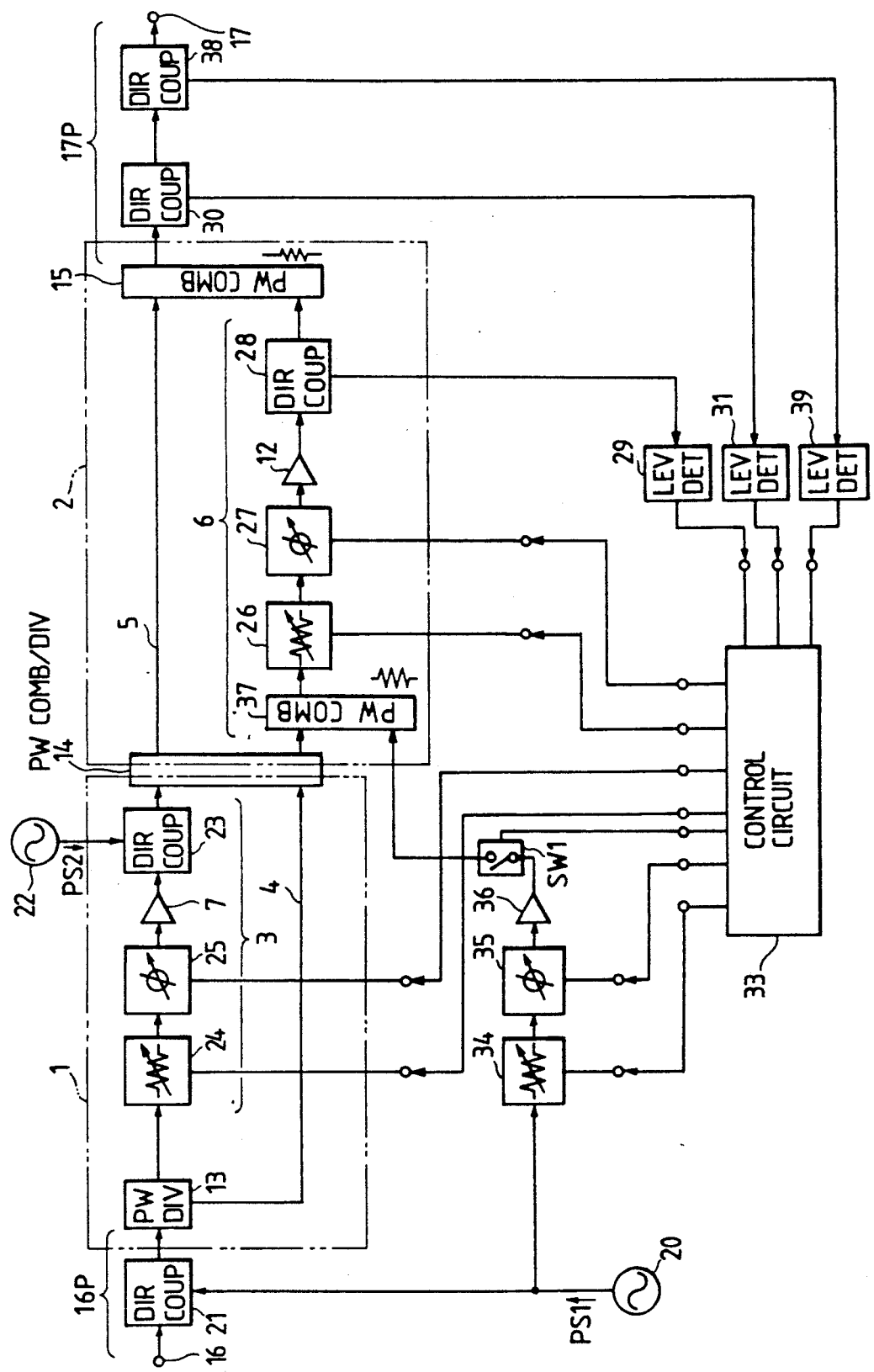
FIG. 7 is a block diagram illustrating still another embodiment of the present invention.

The embodiment of FIG. 7 is identical in construction with the FIG. 6 embodiment except that the directional coupler 28 is connected to the output side of the auxiliary amplifier 12, and the switch SW1 is provided in the signal path between the amplifier 36 and the power combiner 37 and is placed under control of the control circuit 33. The switch SW1 is held open while the error detection circuit 1 and the error rejection circuit 2 are adjusted using the level detectors 29 and 31, respectively. After the adjustment the switch SW1 is closed to apply therethrough the first pilot signal PS1 to the power combiner 37 and the variable attenuator 34 and the variable phase shifter 35 are automatically adjusted by the control circuit 33 so that the level of the first pilot signal detected by the level detector 39 is reduced to a minimum.

While in the embodiments described above in respect of FIGS. 4, 6 and 7 different frequencies are selected for the first and second pilot signals so that their signal components can be detected by the level detectors 29 and 31 in distinction from each other, the same frequency can be used for the both pilot signals PS1 and PS2 in the embodiments of FIGS. 4, 6 and 7 by making provision for applying the first and second pilot signals to the directional couplers 21 and 23 at different time points, since the error detection circuit 1 and the error rejection circuit 2 cannot simultaneously be adjusted for balancing.

Figure 8:
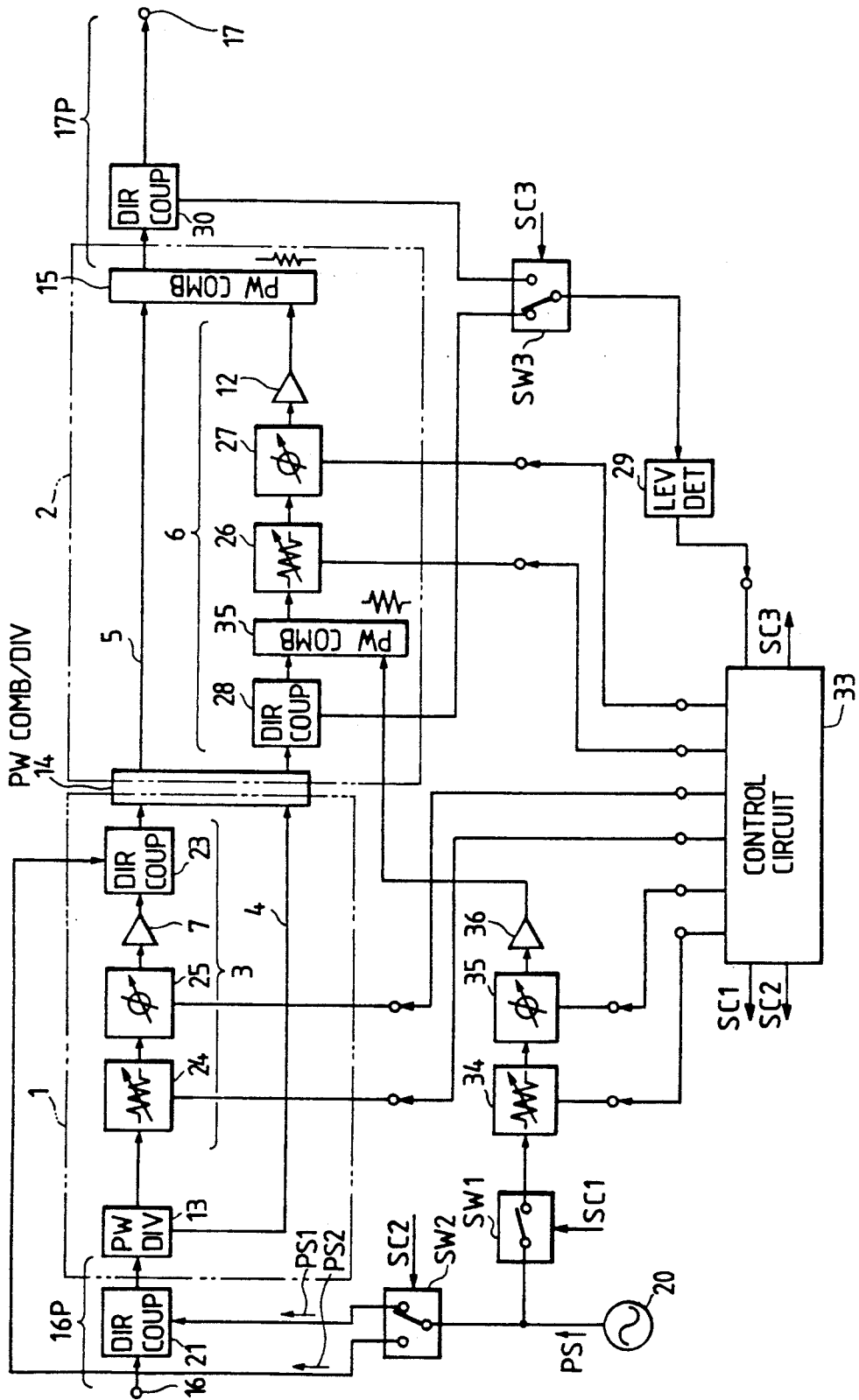
FIG. 8 is a block diagram illustrating a further embodiment of the present invention.

FIG. 8 illustrates another embodiment of the present invention, in which one pilot signal generator is used and a pilot signal therefrom is switched by a switch for supply to the directional couplers 21 and 23 in the embodiment of FIG. 6. A switch SW2 is controlled by a switch control signal SC2 from the control circuit 33 to switch a pilot signal PS between the directional couplers 21 and 23. Moreover, the directional coupler 28 in the error injection circuit 6 and the directional coupler 30 in the signal output path 17P are selectively connected via a switch SW3 to the level detector 29 in accordance with a switch control signal SC3 from the control circuit 33 to detect the level of either one of the first and second pilot signal components of the same frequency. The control circuit 33 first connects the switch SW2 to the directional coupler 21 and the switch SW3 to the directional coupler 28 (while holding the switch SW1 open) by the control signals SC2 and SC3 and then controls the variable attenuator 24 and the variable phase shifter 25 so that the level of the component of the pilot signal PS on the error injection path 6, detected by the level detector 29, decreases to a minimum. Next, the control circuit 33 connects the switches SW2 and SW3 to the directional couplers 23 and 30, respectively, by the control signals SC2 and SC3 and then adjusts the variable attenuator 26 and the variable phase shifter 27 so that the level of the component of the pilot signal PS on the signal output path 17P, detected by the level detector 29, decreases to a minimum. Following this, the control circuit 33 connects the switch SW2 to the directional coupler 21 by the control signal SC2, closes the switch SW1 by the control signal SC1 (while holding the switch SW3 connected to the directional coupler 30) and then adjusts the variable attenuator 34 and the variable phase shifter 35 so that the level of the pilot signal PS on the signal output path 17P, detected by the level detector 29, decreases to a minimum.

In the case where the adjustment of the variable attenuator 34 and variable phase shifter 35 is needed only at the start of use of the feed-forward amplifier and at the time of its maintenance and inspection in the embodiments of FIGS. 6, 7 and 8, a manually adjustable semi-fixed variable attenuator and a variable phase shifter may be used as the attenuator 34 and the phase shifter 35, in which case the level of the first pilot signal provided at the output terminal 17 is measured by an operator using a separately prepared selective level meter and the variable attenuator and the variable phase shifter are manually adjusted so that the detected level is reduced to a minimum. In this instance, the feed-forward amplifier in FIGS. 6 and 7 need not be provided with either of the directional coupler 38 and the level detector 39, and the control circuit 33 needs only to automatically control the variable attenuators 24, 26 and the variable phase shifters 25, 27.

Figure 9:
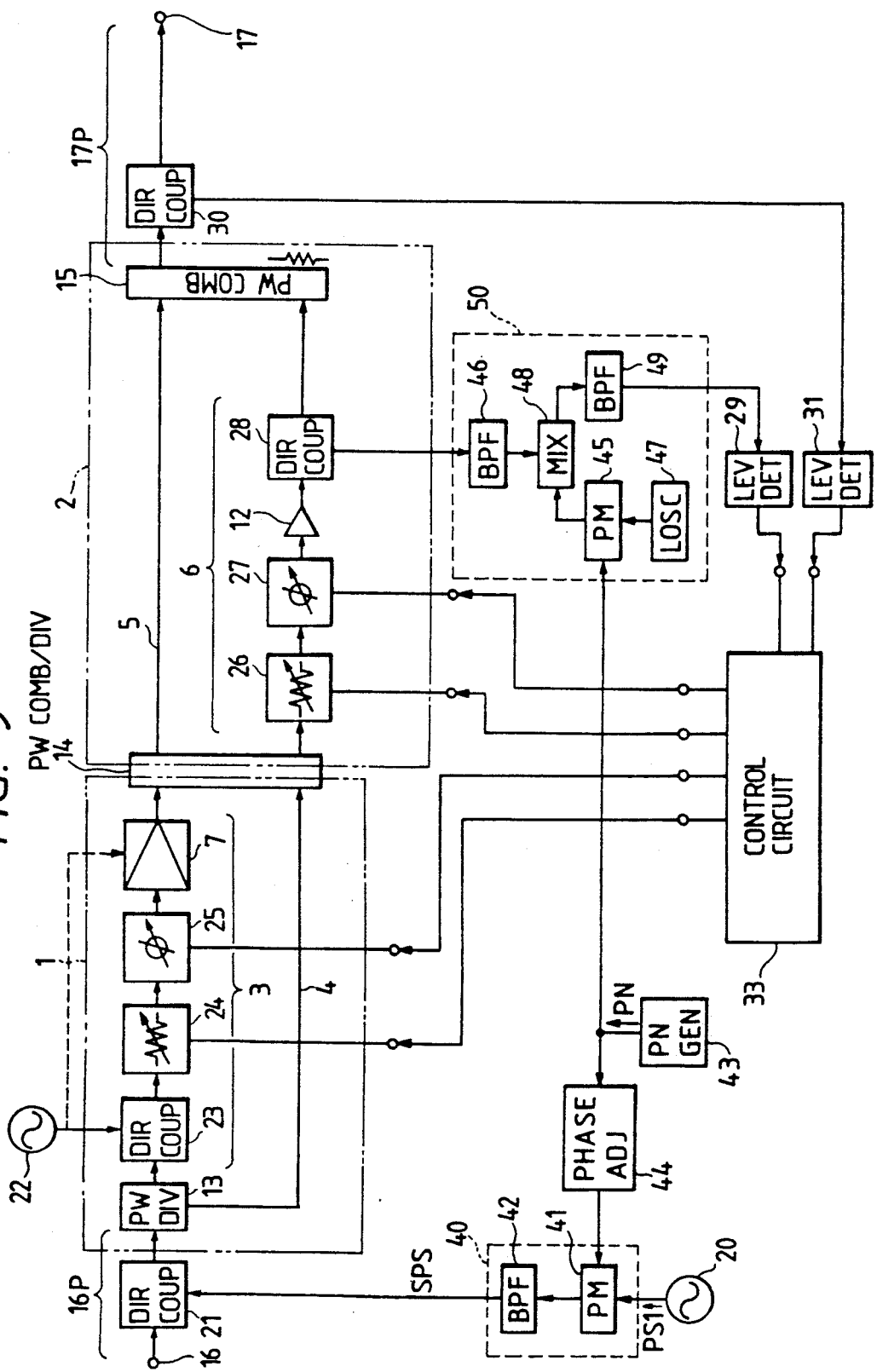
FIG. 9 is a block diagram illustrating still a further embodiment of the present invention.

FIG. 9 illustrates still another embodiment of the present invention. In this embodiment the first pilot signal PS1 is frequency spread substantially all over the frequency band of the input signal to decrease the power of the first pilot signal PS1 per unit spectrum, by which the level of the first pilot signal contained as noise in the output signal of the feed-forward amplifier is kept much lower than a predetermined value. That is, this embodiment does not employ the band-pass filter 32 used in the FIG. 4 embodiment but instead uses, as means for eliminating the first pilot signal PS1, a pseudo noise signal generator 43 for generating pseudo noise signal PN and a pilot signal modulation circuit 40 for phase modulating the first pilot signal PS1 with the pseudo noise signal PN. Furthermore, a pilot signal demodulation circuit 50 is provided for extracting the first pilot signal PS1 from the error injection path 6, and the level of the first pilot signal PS1 thus demodulated is detected by the level detector 29. As has been well-known in this field, the pseudo noise signal generator 43 can be constructed by a shift register of m stages, and produces repetition of a basic random code sequence of a $2^m$-bit length.

The pilot signal modulation circuit 40 comprises a phase modulator 41 and a band-pass filter 42. The phase modulator 41 may be a two-phase of four-phase modulator, but it may also be replaced by an amplitude modulator. The pilot signal demodulation circuit 50 comprises a phase modulator 45, a band-pass filter 46, a local oscillator 47, a mixer 48 and a pilot band-pass filter 49. The pseudo noise signal PN generated by the pseudo noise signal generator 43 is applied to the phase modulators 41 and 45 in the modulation circuit 40 and the demodulation part 50. A phase adjuster 44 is provided to adjust the phase of the pseudo noise signal PN to the modulation circuit 40 in this example so as to establish synchronization between the pseudo noise signals PN that are injected into the modulation circuit 40 and the demodulation circuit 50, respectively.

In this instance, however, it is also possible to adjust the phase of the pseudo noise signal PN which is applied to the demodulation circuit 50.

The pilot signal generator 20 generates the first pilot signal PS1 as a continuous wave which has a frequency $f_P$ and a level $L_1$ dB/Hz and which is applied to the phase modulator 41. The phase modulator 41 phase modulates the first pilot signal PSI by the pseudo noise signal PN to obtain a spectrum-spread pilot signal SPS. which is applied to the directional coupler 21. For example, assuming that the pseudo noise signal PN has a rate of 500 kbps and a level of 0 dB and that the conversion gain of the phase modulator 41 is 0 dB, the level of the spectrum-spread pilot signal SPS per unit hertz is reduced, ideally, more than 50 dB as compared with the level $L_1$ of the pilot signal PS1; namely, the level of the pilot signal which is provided to the output terminal 17 can be made lower than an allowable level. Conversely, when the allowable level of the pilot signal to the error detection circuit 1 per unit frequency is set to a fixed value, the power of the first pilot signal PS1 can be dispersed by spectrum spreading the signal PS1 with the pseudo noise signal PN of the 500 kps rate, and consequently, the pilot signal PS1 can be used up to a level 50 dB higher than a predetermined allowable level.

A signal extracted from the directional coupler 28 of the error injection path 6 is applied to the band-pass filter 46 of the pilot signal demodulation circuit 50, wherein a signal of a band containing the spectrum-spread pilot signal component (affected by the transmission characteristics of the passages through which it has passed) is extracted and is then provided to the mixer 48. A local signal of a frequency $f_L$, generated by the local oscillator 47, is phase modulated by the pseudo noise signal PN in the phase modulator 45 and the phase-modulated signal is applied to the mixer 46, by which is demodulated the first pilot signal having its frequency converted to $(f_P-f_L)$. The thus demodulated pilot signal is extracted by the band-pass filter 49 and is applied to the level detector 29, by which its level is detected. Thus, in the embodiment of FIG. 9 the first pilot signal is spectrum spread and its power per unit spectrum at the output terminal 17 of the feed-forward amplifier is negligibly small, but the level detector 31 is supplied with the pilot signal of a sufficiently high level demodulated by the pilot signal demodulation part 50. In addition, the power of the pilot signal spectrum spread by the pseudo noise signal PN is converged by such correlative demodulation processing as mentioned above, as is well-known in the art, but the power of a signal with no correlation to the pseudo noise signal PN is diverged by such processing; hence, the pilot signal detection sensitivity can be further increased. Accordingly, the control circuit 33 can adjust the variable attenuator 24 and the variable phase shifter 25 with a high degree of accuracy.

Where the above-mentioned arrangement, in which the pilot signal is frequency spread and then injected into the balanced circuit and the pilot signal is obtainable by correlative demodulation from its output signal, is applied to the injection and detection of the second pilot signal PS2 as described later on, the level of the second pilot signal can be detected by the level detector 31 with high sensitivity. While the FIG. 9 embodiment shows the case where the pilot signal is directly spectrum spread in the modulation circuit 40 and the demodulation circuit 50, exactly the same operation and effect as mentioned above would be obtainable with the use of a frequency hopping or chirp method, or a hybrid method which is a combination thereof.

FIG. 10 illustrates an arrangement which is used as a substitute for the oscillator 20, the modulation circuit 40, the pseudo noise signal generator 43 and the demodulation circuit 50 in FIG. 9 in the case of generating the pilot signal and demodulating it by use of the frequency hopping method. More specifically, FIG. 10 shows examples of the constructions of a pilot signal generation circuit 53 for generating the spectrum-spread pilot signal SPS by the frequency hopping method and the pilot signal demodulation circuit 50 for demodulating the pilot signal by the frequency hopping method. In the pilot signal generation circuit 53 the oscillation frequency of a frequency synthesizer 51 is controlled by the pseudo noise signal PN from the pseudo noise generator 43 to generate the spectrum-spread first pilot signal SPS, which is applied to the band-pass filter 42 to remove unnecessary harmonic components, thereafter being applied to the directional coupler 21 in FIG. 9. In the demodulation circuit 50 the signal from the directional coupler 28 is applied to the band-pass filter 46 to extract the spectrum-spread pilot signal, which is applied to the mixer 48. On the other hand, the oscillation frequency of a frequency synthesizer 52 is controlled by the pseudo noise signal PN from the pseudo noise generator 43 and the synthesizer output is provided to the mixer 48, wherein it is frequency mixed with the spectrum-spread pilot signal to thereby demodulate the pilot signal. The pilot signal thus demodulated is applied via the band-pass filter 49 to the level detector 29.

The hopping frequencies which are the oscillation frequencies of the frequency synthesizers 51 and 52 in the pilot signal generation circuit 53 and the demodulation circuit 50 are given by the pseudo noise signal PN from the common pseudo noise generator 43, and the signals PN are phase synchronized by the phase adjuster 44 with each other. When a predetermined offset frequency is added to the oscillation frequency of each of the two frequency synthesizers 51 and 52, a continuous wave of a frequency equal to the offset frequency and of a level proportional to the power of the pilot signal input into the demodulation circuit 50 is output therefrom. By detecting the level of this output continuous wave with the level detector 29, the balance-adjustment of the error detection circuit 1 can be achieved with high accuracy as in the embodiment described above with reference to FIG. 9. It is also possible to employ the chirp method in the same manner as is the case with the frequency hopping method or the hybrid method which is a combination of them. Also it is possible to adopt in the above an arrangement in which the spectrum-spread pilot signal is input into the directional coupler 21 after being frequency converted with a local carrier and, in the demodulation circuit 50, the pilot signal is demodulated after being converted using the local carrier into the initial frequency band.

Figure 11:
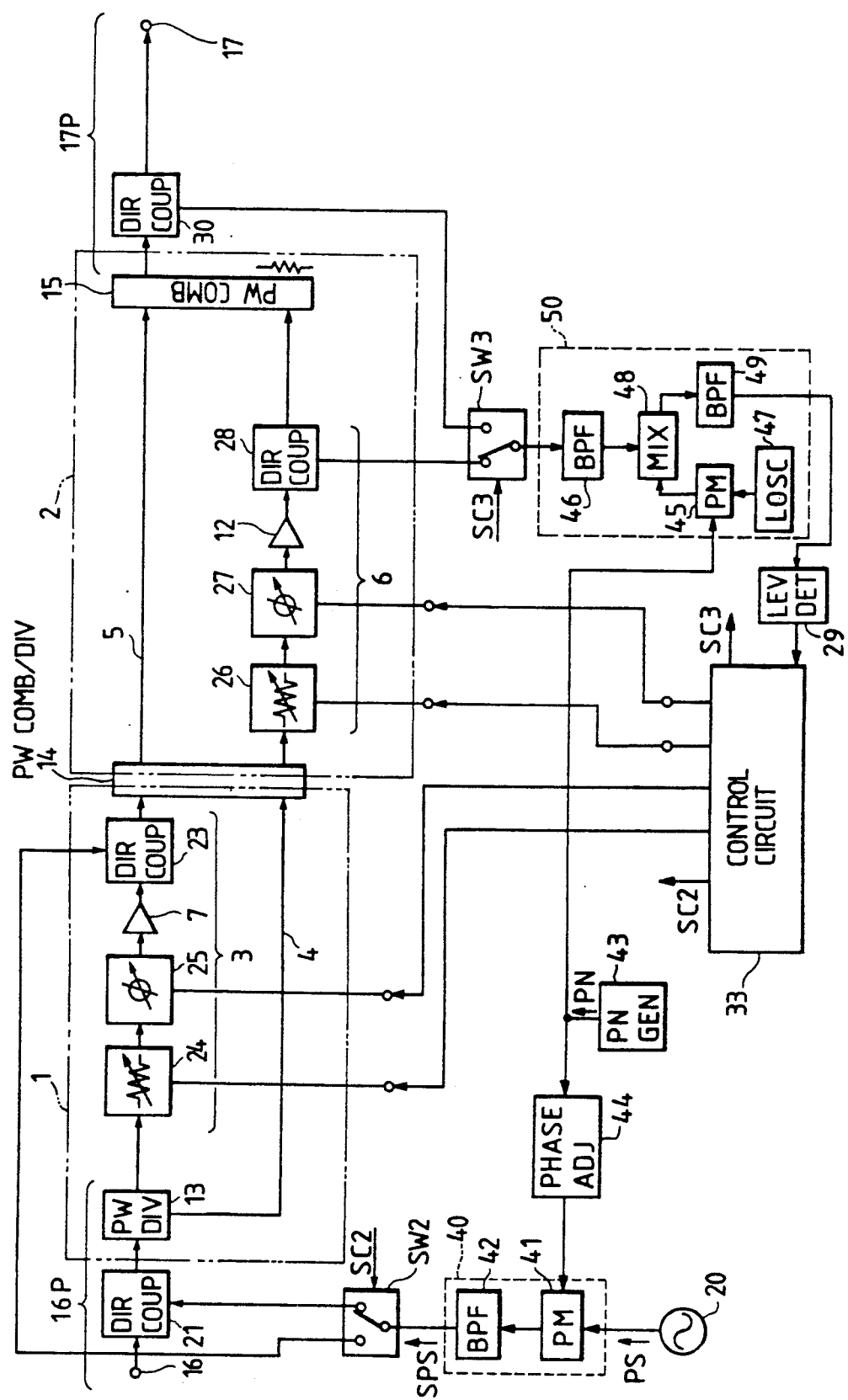
FIG. 11 is a block diagram showing another modified form of the FIG. 9 embodiment.

Also in the embodiment of FIG. 10 the same pilot signal may be switched between the directional couplers 21 and 23 by means of a switch as in the embodiment of FIG. 8. An example of such an arrangement is depicted in FIG. 11, in which the directional coupler 23 is provided at the output side of the main amplifier 7. The pilot signal SPS spectrum spread in the modulation circuit 40 is selectively provided, as a spectrum-spread first or second pilot signal, via the switch SW2 to the directional coupler 21 or 23. On the other hand, the directional couplers 28 and 30 are selectively connected via the switch SW3 to the demodulation circuit 50. To adjust the balance of the error detection circuit 1, the control circuit 33 first controls the switches SW2 and SW3 to supply the spectrum-spread pilot signal SPS to the directional coupler 21 and connect the directional coupler 28 to the demodulation circuit 50. In this state the control circuit 33 adjusts the variable attenuator 24 and the variable phase shifter 25 so that the level of the pilot signal PS demodulated in the demodulation circuit 50 decreases to a minimum. Next, the control circuit 33 changes over the switches SW2 and SW3 to supply the spectrum-spread pilot signal SPS to the directional coupler 23 and connect the directional coupler 30 to the demodulation circuit 50. In this state the control circuit 33 adjusts the variable attenuator 26 and the variable phase shifter 27 so that the level of the pilot signal SPS demodulated in the demodulation circuit 50 decreases to a minimum.

In a similar manner, the embodiment of FIG. 10 can be modified as indicated by broken lines so that the output of the pilot signal generation circuit 53 is selectivley supplied as the first and second pilot signals to the directional couplers 21 and 23 via a switch SW2, and the input of the demodulation circuit 50 is selectively connected to the directional couplers 28 and 30 via a switch SW3 to receive the first and second pilot signals.

Although the embodiments of FIGS. 4 and 6 through 11 have been described in connection with the case where the second pilot signal PS2 is injected via the directional coupler 23 to the input or output side of the main amplifier 7 on the signal amplification path 3, provision may also be made for injecting the second pilot signal PS2 into an internal circuit point of the main amplifier 7 as indicated by the broken line in FIG. 9. For instance, FIG. 12 shows the case where the main amplifier 7 is formed by a cascade connection of two amplifying elements 7A and 7B and the directional coupler 23 is interposed therebetween. The second pilot signal PS2 from the oscillator 22 is injected into the signal amplification path 3 via the directional coupler 23 between the amplifying elements 7A and 7B. By effecting a circuit adjustment of the main amplifier 7 during its manufacture to obtain its desired operation characteristic and by fabricating the amplifier 7 and the directional coupler 23 as an integrated module, the design of the feed-forward amplifier is made easy and its assembling is also easy because of handling the integrated and adjusted main amplifier module. Moreover, this structure permits the use of a directional coupler for lower power use and improves isolation as compared with the circuit construction in which the second pilot signal PS2 is injected into the signal amplification path 2 at the output side of the main amplifier 7. Conversely, the error or distortion of the second pilot signal PS2 by the main amplifier 7 is smaller than in the case where the directional coupler 23 is disposed at the input side of the main amplifier 7. The number of stages of the cascade-connected amplifying elements may also be made three or more. Whether the amplifying elements 7A and 7B are each formed by a single or plural transistors, the second pilot signal PS2 may be injected via the directional coupler 23 into any of the emitter, collector and base of a desired one of the transistors forming the amplifying element 7A or 7B. FIG. 13 shows the case where the amplifying elements 7A and 7B are each formed by a single grounded-emitter transistor and the second pilot signal PS2 from the oscillator 22 is injected via the directional coupler 23 into the collector terminal of the amplifying element 7B. In FIG. 13, reference character Vcc indicates a power source voltage.

Figure 14:
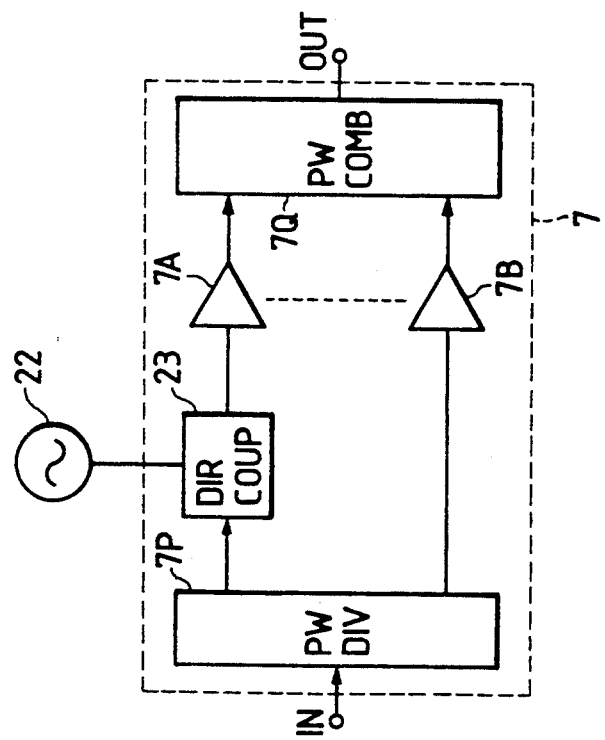
FIG. 14 is a block diagram illustrating still another example of the main amplifier in the FIG. 9 embodiment.

Furthermore, the main amplifier 7 may also be formed by a parallel connection of two or more amplifying elements between a power divider 7P and a power combiner 7Q, as indicated by the amplifying elements 7A and 7B in FIG. 14. In this instance, the second pilot signal PS2 may be injected into an input or output terminal of any one of the amplifying elements 7A and 7B disposed between the power divider 7P and the power combiner 7Q, or it may also be injected via the directional coupler 23 into the emitter, collector or base of an arbitrary one of the transistors constituting the amplifying elements 7A and 7B. It is also possible that a cascade connection of two or more stages of amplifying elements is provided in each of the parallel circuits.

Figure 15:
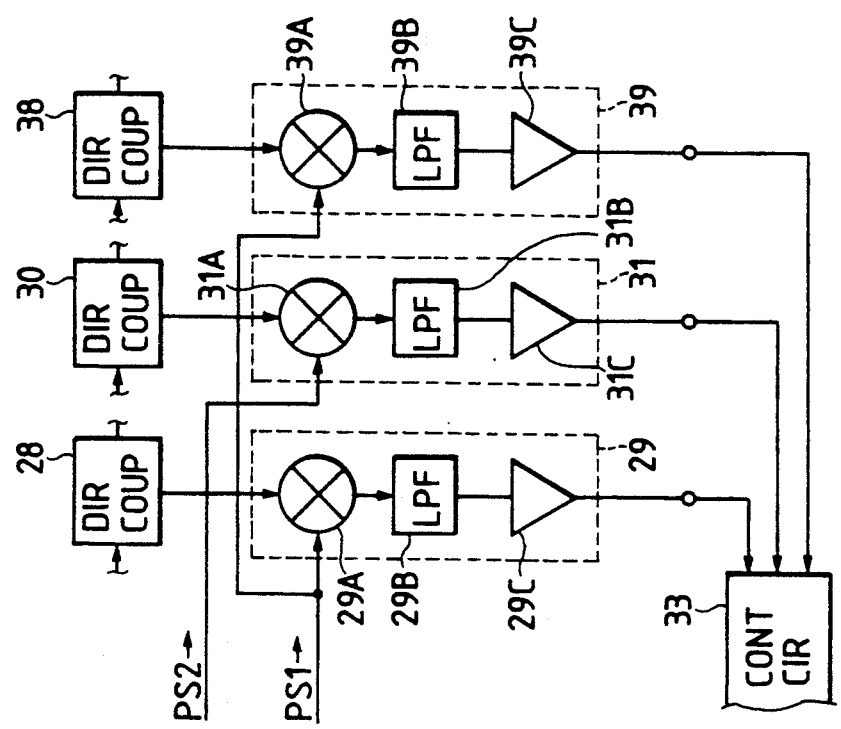
FIG. 15 is a block diagram showing examples of three level detectors.

In the embodiments of FIGS. 4, 6, 7 and 8, the level detectors 29, 31 and 39 may each be formed by a homodyne detection circuit. FIG. 15 shows an example in which the level detectors 29, 31 and 39 in the FIG. 6 or 7 embodiment are formed by homodyne detection circuits. The homodyne detection circuit 29 is made up of a mixer 29A, a low-pass filter 29B and a direct current amplifier 29C. A signal extracted by the directional coupler 28 from the error injection path 6 is applied to the mixer 29a, wherein it is homodyne detected by the first pilot signal PS1 provided as a local signal from the oscillator 20, and as a result of this, a signal which contains a direct current level proportional to the level of the first pilot signal component in the signal from the directional coupler 28 is output from the mixer 29A. The direct current component in the output signal is extracted by the low-pass filter 29B and amplified by the direct current amplifier 29C, thereafter being applied to the control circuit 33 as the detected level of the first pilot signal component on the error injection path 6. Such a homodyne detection circuit permits a high-sensitivity detection of the level of the first pilot signal component. The homodyne detection circuits 31 and 37 are identical in construction with the circuit 29 and homodyne detect the level of the second pilot signal component and the level of the first pilot signal component by the second and first pilot signals PS2 and PS1 as local signals from the oscillators 22 and 20, respectively, and then provide the detected outputs to the control circuit 33.

Figure 17:
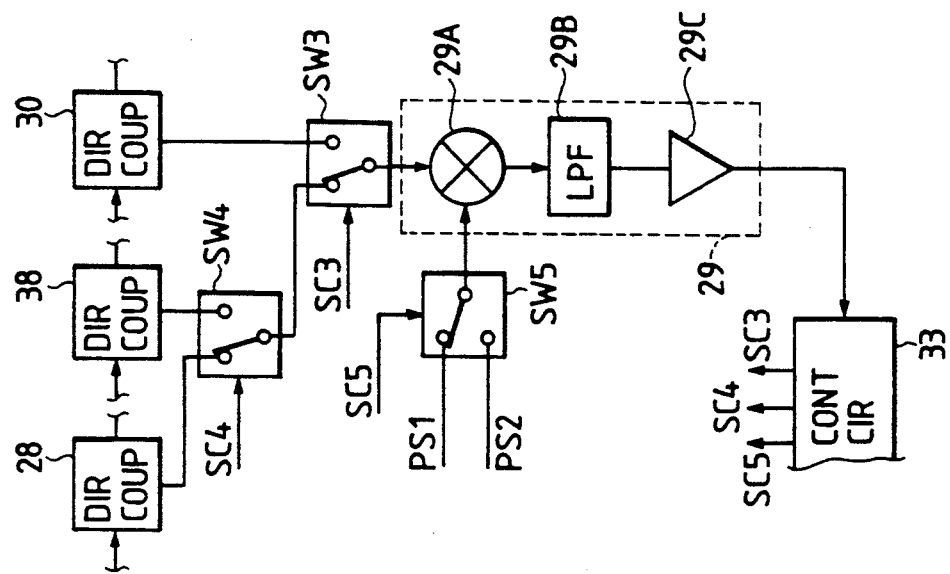
FIG. 17 is a block diagram showing an example in which the three level detectors in FIG. 15 are formed by one detector.
Figure 16:
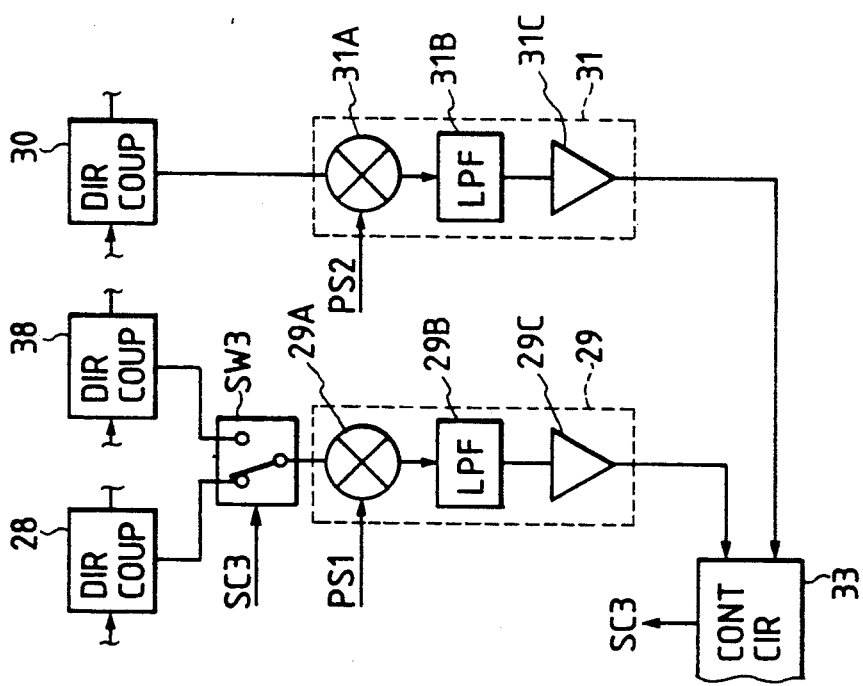
FIG. 16 is a block diagram showing an example in which two of the three level detectors in FIG. 15 are formed by one detector.

It is also possible to adopt a circuit arrangement in which the homodyne detection circuit 29 in FIG. 15 is used also as the homodyne detection circuit 39 and is connected via the switch SW3 to a selected one of the directional couplers 28 and 38 as shown in FIG. 16. The balance of the error detection circuit 1 is adjusted in the state in which the switch SW3 is being connected to the directional coupler 28 in accordance with the control signal SC3. Further, the first pilot signal PS1 on the signal output path 17P is cancelled in the state in which the switch SW3 is being connected to the directional coupler 38 in accordance with the control signal SC3. Also it is possible to employ a circuit arrangement in which the homodyne detection circuit 29 in FIG. 16 is used also as the homodyne detection circuit 31 and is selectively connected to the directional couplers 28, 30 and 38 via the switches SW3 and SW4 as depicted in FIG. 17. The adjustment of the error detection circuit 1 for balancing it takes place while connecting the switch SW3 to the switch SW4 by the control signal SC3, the switch SW4 to the directional coupler 28 by the control signal SC4 and a switch SW5 to the first pilot signal PS1 (i.e. to the oscillator 20) by a control signal SC5. The adjustment of the error rejection circuit 2 takes place while connecting the switch SW3 to the directional coupler 30 by the control signal SC3 and the switch SW5 to the second pilot signal PS2 (i.e. to the oscillator 22) by the control signal SC5. Moreover, the first pilot signal PS1 on the signal output path 17P is cancelled, with the switch SW3 connected to the switch SW4 by the control signal SC3, the switch SW4 connected to the directional coupler 38 by the control signal SC4 and the switch SW5 connected to the oscillator 20 by the control signal SC5.

In the case where a plurality of feed-forward amplifiers such as shown in FIG. 4, 6, 7, or 8 are employed in parallel relation for the purpose of obtaining a high output power, if continuous waves are used as pilot signals there is the possibility that the pilot signal of a certain feed-forward amplifier may interfere with the pilot signal of another feed-forward amplifier, making it difficult to accurately detect the levels of the pilot signals. The reason for this is that the pilot signals are required to be suppressed down to an extremely low level below 60 dB stipulated by radio regulations in Japan, as compared with the input signal level. To solve this problem, either one or both of the first and second pilot signals in FIG. 4, 6, 7, or 8 may be modulated. For example, a first pilot signal generator 55, made up of a frequency synthesizer 56 for generating a first pilot signal PS1 of a desired base band frequency, a local oscillator 57, a modulator 58 and a band-pass filter 59 as shown in FIG. 18A, is used as means for generating the modulated first pilot signal MPS1, in place of the oscillator 20 in the FIG. 6 or 7 embodiment. A second pilot signal generator 60, made up of a frequency synthesizer 61 for generating a second pilot signal PS2 of a desired base band frequency, a local oscillator 62, a modulator 63 and a band-pass filter 64 as shown in FIG. 18B, is employed as means for generating the modulated second pilot signal MPS2, in place of the oscillator 22. Furthermore, a first pilot signal demodulation part 65A, composed of a band-pass filter 66A, a demodulator 67A and a low-pass filter 68A, for demodulating the first pilot signal PS1 is connected between the directional coupler 28 and the level detector 29 in the error injection path 6 as depicted in FIG. 18C. Similarly, a first pilot signal demodulation part 65B, composed of a band-pass filter 66B, a demodulator 67B and a low-pass filter 68B, is connected between the directional coupler 38 and the level detector 39 in the signal output path 17P. Besides, a second pilot signal demodulation part 70, composed of a band-pass filter 71, a demodulator 72 and a low-pass filter 73, is connected between the directional coupler 39 and the level detector 31 in the signal output path 17P, for demodulating the second pilot signal PS2. The modulators 58, 63 and the demodulators 67A, 67B, 72 are each formed by a frequency modulator/demodulator, phase modulator/demodulator, or amplitude modulator/demodulator.

Figure 19:
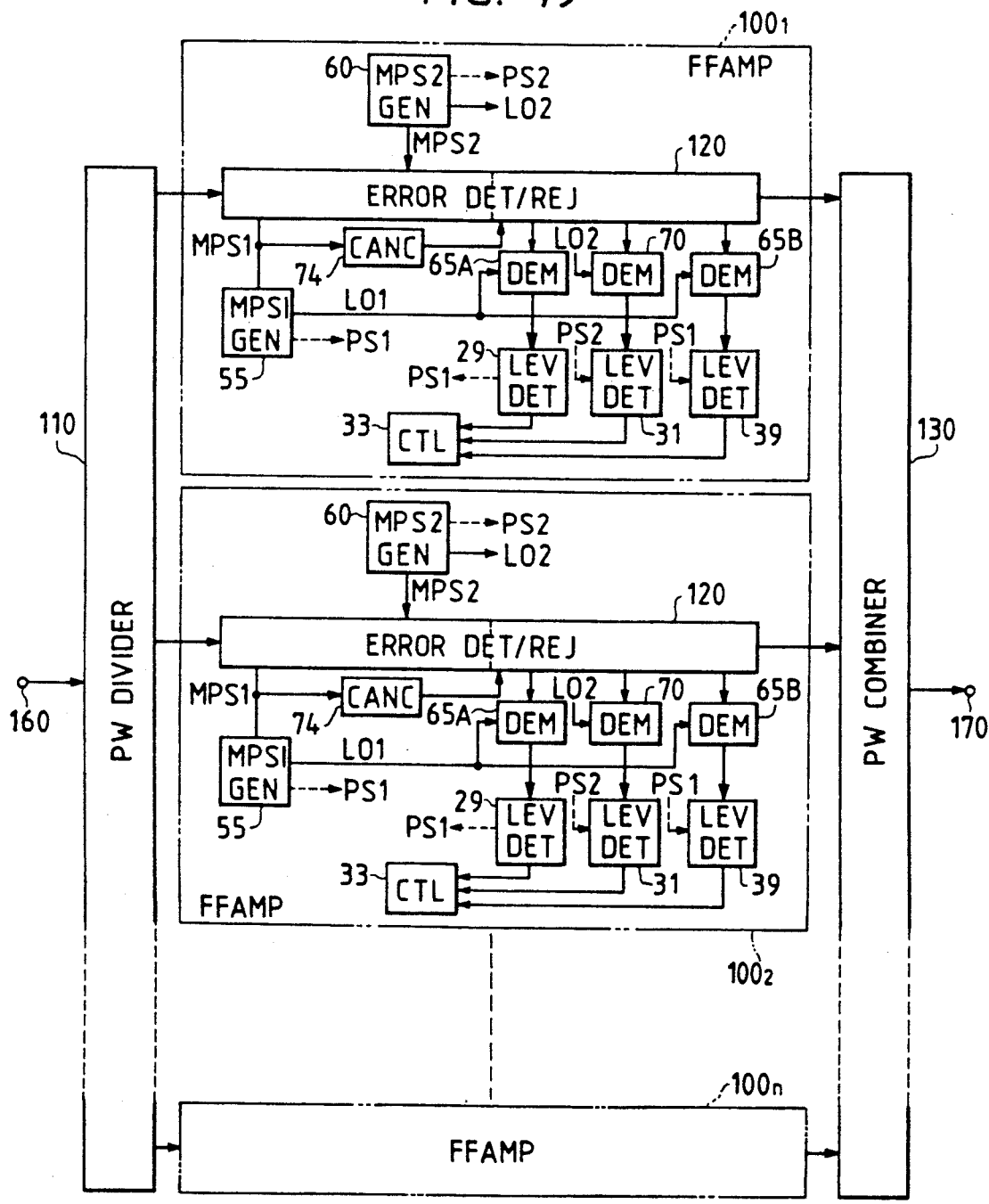
FIG. 19 is a block diagram illustrating a linear amplifier formed by a parallel connection of a plurality of feed-forward amplifiers each employing the modulated pilot signals.

FIG. 19 shows an example of a linear amplifier in which a plurality of feed-forward amplifiers using the above-said modulated first and second pilot signals are arranged in parallel. An input signal from an input terminal 160 is divided by a power divider 110 to n feed-forward amplifiers $100_1$ to $100_n$ of the same construction and their outputs are combined by a power combiner 130, thereafter being provided to an output terminal 170. In each of the amplifiers $100_1$ to $100_n$ an error detection/rejection circuit 120 represents, by one block, all of the directional couplers 21, 30, 38, the error detection circuit 1 and the error rejection circuit 2 in the FIG. 6 or 7 embodiment, for instance, and a cancellation circuit 74 represents, by one block, all of the variable attenuator 34, the variable phase shifter 35 and the amplifier 36. However, there are not shown control lines from the control circuit 33 for controlling the variable attenuators 24, 26, 34 and the variable phase shifters 25, 27, 35.

In the case of arranging the plurality of feed-forward amplifiers $100_1$ to $100_n$ in parallel, their frequency synthesizers 56 are each set to generate the first pilot signal PS1 of a different base band frequency and each of the frequency synthesizers 61 is also similarly set to generate the second pilot signal PS2 of a different base band frequency. The first pilot demodulation parts 65a, 65b and the second pilot demodulation part 70 share the first pilot signal generator 55, the second pilot signal generator 60 and the local oscillators 57, 62, and hence are regarded as being synchronized with each other. While in this example the first and second pilot signals PS1 and PS2 are both modulated, the second pilot signal PS2 need not always be modulated. By using different frequencies for the pilot signals and modulating them as mentioned above, it is possible to prevent interference between the pilot signals of the amplifiers $100_1$ to $100_n$ and hence detect the individual pilot signals with high sensitivity, even when the plurality of amplifiers are arranged in parallel.

Figure 20:
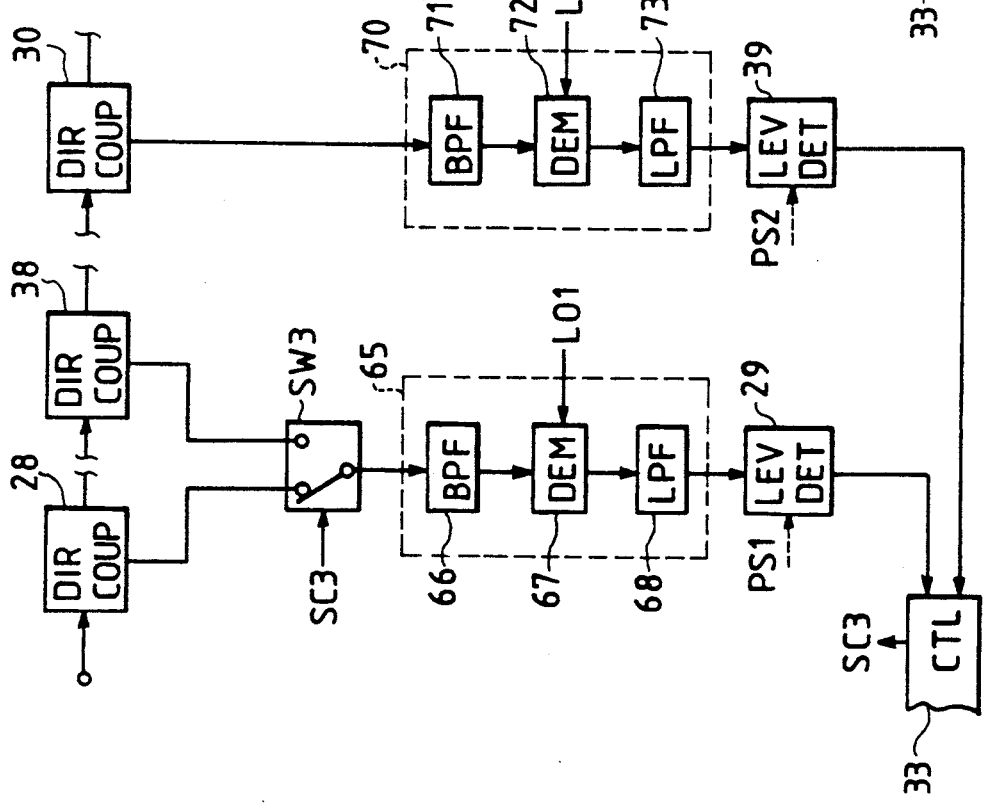
FIG. 20 is a block diagram showing the circuit construction for use in the case where two demodulation parts are combined into one in FIG. 18C.

As is the case with the FIG. 16 embodiment, it is possible to employ an arrangement in which the first pilot signal demodulation parts 65A and 65B in FIG. 18C are combined into a single first pilot signal demodulation part 65 and it is selectively connected via the switch SW3 to the directional couplers 28 and 39 as depicted in FIG. 20. The balance of the error detection circuit 1 is adjusted, with the switch SW3 connected to the directional coupler 28 by the control signal SC3. The modulated first pilot signal MPS1 in the signal output path 17P is cancelled, with the switch SW3 connected to the directional coupler 38 by the control signal SC3.

Figure 21:
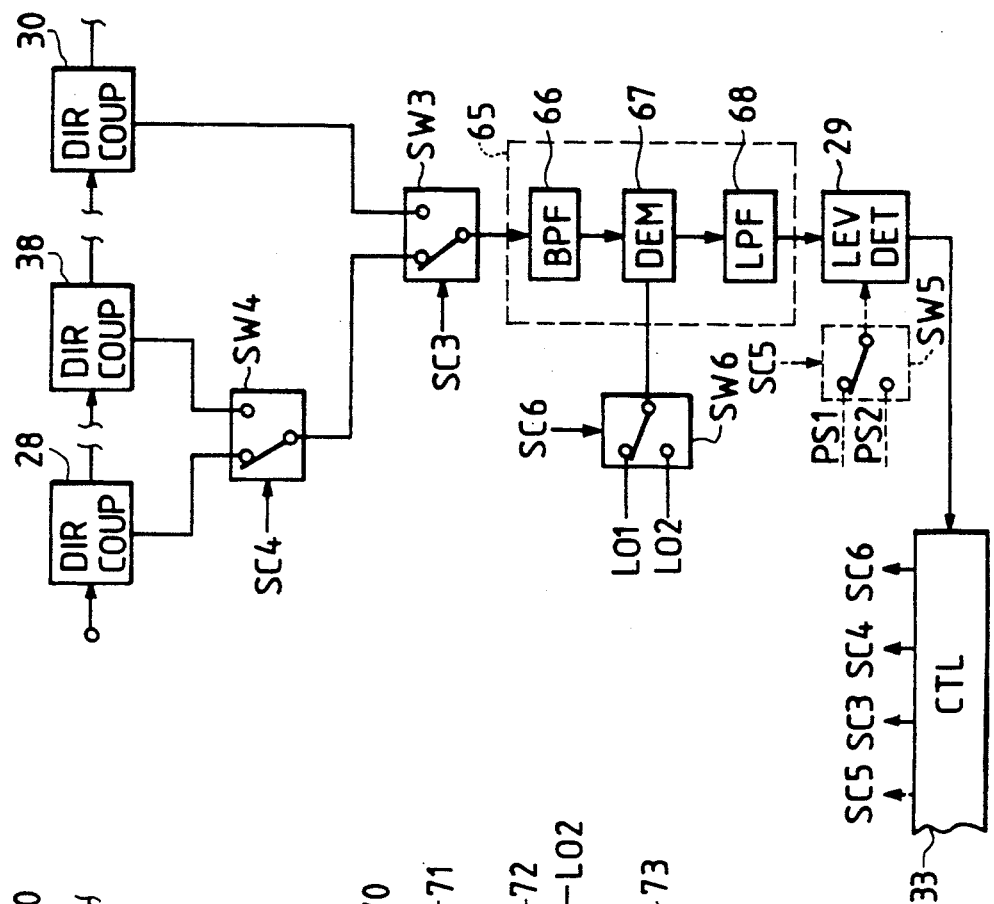
FIG. 21 is a block diagram showing the circuit construction for use in the case where two demodulation parts are further combined into one in FIG. 20.

Furthermore, it is also possible, as is the case with the FIG. 17 embodiment, to adopt an arrangement in which the first pilot signal demodulation part 65 in FIG. 20 is used also as the second pilot signal demodulation part 70 and is selectively connected via the switches SW3 and SW4 to the directional couplers 29, 30 and 38 as shown in FIG. 21. In this instance, the balance of the error detection circuit 1 is adjusted, with the switch SW3 connected to the switch SW4 by the control signal SC3, the switch SW4 connected to the directional coupler 28 by the control signal SC4 and a switch SW6 connected to the local signal LO1 side by a control signal SC6. The balance of the error rejection circuit 2 is adjusted, with the switch SW3 connected by the control signal SC3 to the directional coupler 30 and the switch SW6 connected by the control signal SC6 to the local signal LO2 side. The modulated first pilot signal MPS1 in the signal output path 17P is cancelled, with the switch SW3 connected by the control signal SC4, the switch SW4 connected by the control signal SC4 to the directional coupler 38 and the switch SW6 connected by the control signal SC6 to the local signal LO1 side.

In the embodiments of FIGS. 18C, 20 and 21 the level detectors 29, 31 and 39 may each be formed by a homodyne detection circuit as described above in respect of FIGS. 15, 16 and 17. In this instance, as is the case with FIGS. 15, 16 and 17, the first and second pilot signals PS1 and PS2 from the frequency synthesizers 56 and 61 are applied to the level detectors 29, 31 and 39 as indicated by the broken lines in FIGS. 18A, 18B, 18C, 20 and 21.

Figure 22:
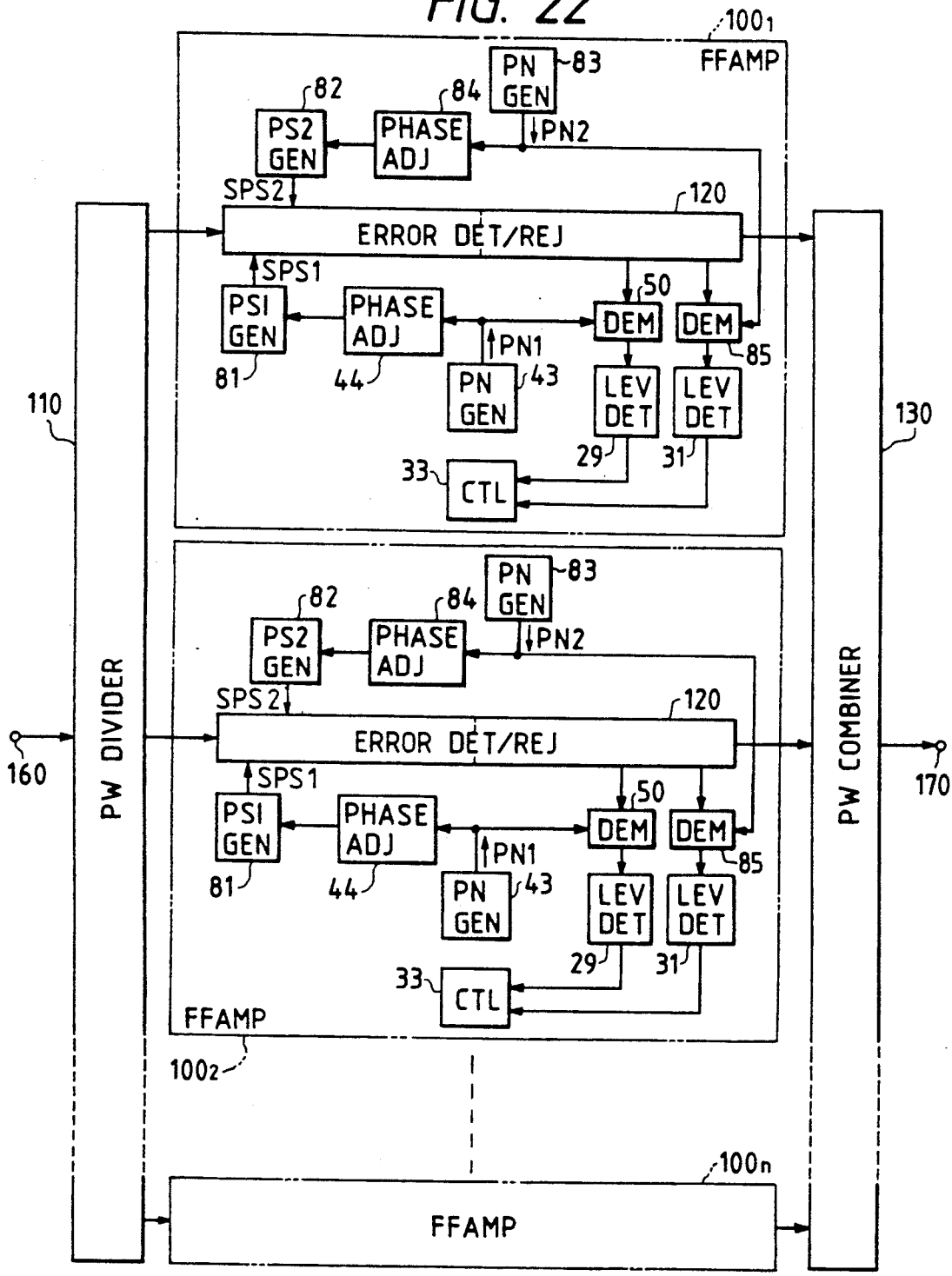
FIG. 22 is a block diagram illustrating a linear amplifier comprised of a parallel connection of a plurality of feed-forward amplifiers each employing a spectrum-spread pilot signal.

While in FIG. 19 the linear amplifier is shown to be formed by a parallel connection of feed-forward amplifiers $100_1$ to $100_n$ using different modulated pilot signals, it is also possible to similarly arrange, in parallel, feed-forward amplifiers using spectrum-spread pilot signals as described above in respect of each of FIGS. 9, 10 and 11. FIG. 22 shows an example in which a plurality of such feed-forward amplifiers as depicted in FIG. 9 are arranged in parallel. In this example, the second pilot signal is also spectrum spread, but it need not always be spectrum spread as in the case of FIG. 9. As is the case with the FIG. 19 embodiment, the input signal from the input terminal 160 is divided by the power divider 110 to the n feed-forward amplifiers $100_1$ to $100_n$ of the same construction and their outputs are combined by the power combiner 130, thereafter being provided to the output terminal 170. In each of the amplifiers $100_1$ through $100_n$, the error detection/retection circuit 120 represents, by one block, all of the directional couplers 21, 30, the error detection circuit 1 and the error rejection circuit 2 in the FIG. 9 embodiment, and a first pilot signal generator 81 comprises the oscillator 20, the phase modulator 41 and the band-pass filter 42 in FIG. 9. A second pilot signal generator 82 is identical in construction with the first pilot signal generator 81 and generates the second pilot signal SPS2 spectrum spread by a pseudo noise signal PN2 provided via a phase adjuster 84 from a pseudo noise signal generator 83. The second pilot signal SPS2 thus produced is applied to the directional coupler 23 (see FIG. 9). On the other hand, the pseudo noise signal PN2 is applied to a demodulation part 85 connected to the directional coupler 30, by which the second pilot signal is demodulated. The demodulation parts 50 and 85 are both identical in construction with the demodulation part 50 in FIG. 9. In the embodiment depicted in FIG. 22, the pseudo noise signal generators 43 of the feed-forward amplifiers $100_1$ through $100_n$ generate the pseudo noise signals, based on different initial values of $2^m$-bit code strings. As a result, the pseudo noise signals generated by the pseudo noise signal generators 43 of the respective feed-forward amplifiers $100_1$ through $100_n$, respectively, are uncorrelated with one another. The same is true of the pseudo noise signals generated by the pseudo noise generators 83. In consequence, no interference occurs between the pilot signals of the amplifiers $100_1$ through $100_n$, and consequently, the first and seoond pilot signals can be detected with high sensitivity by the level detectors 29 and 31.

As described above, according to the present invention, the balance of each of the error detection circuit 1 and the error rejection circuit 2 can be automatically adjusted using the first and second pilot signals, and in addition, the first pilot signal component in the output signal can be made sufficiently small. Hence, it is possible to implement a feed-forward amplifier which permits the automatic adjustment even during the input signal amplifying operation.

It will be apparent that many modifications and variations may be effected without departing from the scope of the novel concepts of the present invention.

What is claimed is:

1. A feed-forward amplifier comprising:
   power division means whereby the power of an input signal provided to a signal input path is divided to first and second paths;
   main amplification means inserted in said first path, for amplifying said input signal;
   electrically variable first attenuation means for adjusting the relative levels of signals on said first and second paths;
   electrically variable first phase shift means for adjusting the relative phases of signals on said first and second paths;
   power combiner/divider means for combining the output power of said first and second paths and for dividing said combined power to third and fourth paths;
   electrically variable second attenuation means for adjusting the relative levels of signals on said third and fourth paths;
   electrically variable second phase shift means for adjusting the relative phases of signals on said third and fourth paths;
   auxiliary amplification means inserted in said fourth path;
   power combiner means for combining the outputs of said third and fourth paths and for providing said combined output to a signal output path;
   control means for controlling said first and second variable attenuation means and said first and second variable phase shift means;
   pilot signal injection means for injecting first and second pilot signals into said signal input path and said first path, respectively;
   level detection means for detecting the levels of said first and second pilot signals on said fourth path and said signal output path, respectively; and
   pilot signal elimination means for eliminating said first pilot signal to prevent it from being output from said signal output path;
   wherein said control means adjusts said first variable attenuation means and said first variable phase shift means so that the level of said first pilot signal detected by said level detection means is reduced to a minimum and said control means adjusts said second variable attenuation means and said second phase shift means so that the level of said second pilot signal detected by said level detection means is reduced to a minimum.

2. The feed-forward amplifier of claim 1, wherein said pilot signal elimination means comprises filter means in sad signal output path, said filter means being operative to permit the passage therethrough of the band of said input signal but to inhibit the passage therethrough of said first pilot signal.

3. The feed-forward amplifier of claim 2 wherein said pilot signal injection means includes: first pilot signal generating means for generating said first pilot signal of a predetermined first base band frequency, first local signal generating means for generating a first local signal, and first modulating means for modulating said first local signal with said first pilot signal and injecting its output as a modulated version of said first pilot signal into said signal input path; and wherein said level detection means includes: first demodulation means for demodulating said modulated first pilot signal with said first local signal, and a first level detector for detecting the level of said demodulated first pilot signal.

4. The feed-forward amplifier of claim 1, wherein said pilot signal elimination means includes: a pilot signal injection path for injecting therethrough said first pilot signal from said pilot signal injection means into said fourth path; amplitude adjustment means inserted in said pilot signal injection path, for adjusting the amplitude of said first pilot signal; and phase adjsutment means inserted in said pilot signal injection path, for adjusting the phase of said first pilot signal.

5. The feed-forward amplifier of claim 1, wherein said pilot signal elimination means includes: a pilot signal injection path for injecting therethrough said first pilot signal from said first pilot signal injection means into said signal output path; amplitude adjustment means inserted in said pilot injection path, for adjusting the amplitude of said first pilot signal; and phase adjustment means inserted in said pilot signal injection path, for adjusting the phase of said first pilot signal.

6. The feed-forward amplifier of claim 4 or 5, wherein said amplitude adjustment means and said phase adjustment means are electrically controllable, said pilot signal elimination means including means for causing said level detection means to detect the level of said first pilot signal on said signal output path, and said control means being operative to control said amplitude adjustment means and said phase adjustment means so that the level of said first pilot signal detected by said level detection means is reduced to a minimum.

7. The feed-forward amplifier of claim 6, wherein switching means is inserted in said pilot injection path, and said control means holds said switching means in the ON state to pass therethrough said first pilot signal during the adjustment of said amplitude adjustment means and said phase adjustment means.

8. The feed-forward amplifier of claim 6, wherein said level detection means includes: a common level detector for detecting signal levels; and said means for causing includes a changeover switch for selectively applying said first pilot signal from said fourth path and said signal output path to said common level detector.

9. The feed-forward amplifier of claim 4 or 5, wherein said pilot signal injection means include: a common pilot signal generating means for generating a common pilot signal; first and second directional couplers inserted in said signal input path and said first path, respectively; and a first changeover switch for selectively supplying therethrough said common pilot signal from said pilot signal generating means to said first and second directional couplers as said first and second pilot signals; said pilot signal elimination means including switch means which permits the passage therethrough of said common pilot signal from said common pilot signal generating means to said pilot signal injection path during adjustment of said first variable attenuation means and said first variable phase shift means and during adjustment of said amplitude adjustment means and said phase adjustment means but inhibits the passage therethrough of said common pilot signal at other times.

10. The feed-forward amplifier of claim 9, wherein said level detection means includes: third and fourth directional couplers inserted in said fourth path and said signal output path, respectively; a common level detector for detecting the level of said pilot signal; and a second changeover switch for selectively supplying therethrough the outputs of said third and fourth directional couplers to said common level detector.

11. The feed-forward amplifier of claim 4 or 5, wherein said pilot signal injection means includes: first pilot signal generating means for generating said first pilot signal of a predetermined first base band frequency; first local signal generating means for generating a first local signal; and first modulating means for modulating said first local signal with said first pilot signal and injecting its output as a modulated version of said first pilot signal into said signal input path; and wherein said level detection means includes: first demodulation means for demodulating said modulated first pilot signal with said first local signal; and a first level detector for detecting the level of said demodulated first pilot signal.

12. The feed-forward amplifier of claim 11, wherein said pilot signal injection means further includes: second pilot signal generating means for generating said second pilot signal of a predetermined second base band frequency; second local signal generating means for generating a second local signal; and second modulation means for modulating said second local signal with said second pilot signal and injecting its output as modulated version of said second pilot signal into said first path; and wherein said level detection means further includes: second demodulation means for demodulating said modulated second pilot signal with said second local signal; and a second level detector for detecting the level of said demodulated second pilot signal.

13. The feed-forward amplifier of claim 12, wherein said amplitude adjustment means and said phase adjustment means are electrically controllable, said pilot signal elimination means including means for causing said level detection means to detect the level of said modulated first pilot signal on said signal output path, said control means being operative to control said amplitude adjustment means and said phase adjustment means so that the level of said first pilot signal on said output signal path decreases to a minimum.

14. The feed-forward amplifier of claim 13 wherein said means for causing includes changeover switch means for selectively supplying said modulated first pilot signals from said fourth signal path and said signal output path to said second demodulation means.

15. The feed-forward amplifier of claim 11, wherein said first level detector is a homodyne detection circuit.

16. A linear amplifier assembly comprising: a plurality of said feed-forward amplifiers, each defined by claim 11; power divider means for dividing an input signal to inputs of said plurality of feed-forward amplifiers; and power combiner means for combining the outputs of said plurality of feed-forward amplifiers; wherein said first base band frequency of said first pilot signal of each of said feed-forward amplifiers has a different value.

17. The linear amplifier assembly of claim 16, wherein said pilot signal injection means of each of said feed-forward amplifiers includes: second pilot signal generating means for generating said second pilot signal of a predetermined second base band frequency; second local signal generating means for generating a second local signal; and second modulation means for modulating said second local signal with said second pilot signal and injecting its output as a modulated version of said second pilot signal into said first path; wherein said second level detection means includes: second demodulation means for demodulating said modulated second pilot signal with said second local signal; and a second level detector for detecting the level of said demodulated second pilot signal; and wherein said second base band frequency of said second pilot signal of each of said feed-forward amplifier units has a different value.

18. The linear amplifier assembly of claim 16, wherein said first level detector of each of said feed-forward amplifiers is formed by a homodyne detection circuit.

19. The feed-forward amplifier of claim 1, wherein said pilot signal elimination means includes frequency spread means for spreading the frequency of said first pilot signal to be injected by said pilot signal injection means into said signal input path, and wherein said level detection means includes demodulation means for demodulating said frequency-spread first pilot signal on said fourth path, and a level detector for detecting the level of the demodulated signal and outputting the detected level as the level detected by said level detecting means.

20. The feed-forward amplifier of claim 19, wherein said pilot signal injection means further includes second pilot signal frequency spread means for spreading the frequency of said second pilot signal, and wherein said level detection means includes second pilot signal demodulation means for demodulating said frequency-spread second pilot signal on said signal output path and a second pilot signal detector for detecting the level of the demodulated signal and outputting the detected level as the level detected by said level detection means.

21. The feed-forward amplifier of claim 19, wherein said frequency spread means includes: pseudo noise signal generating means for generating a pseudo noise signal; and first phase modulation means for phase modulating said first pilot signal with said pseudo noise signal and outputting the modulated output as said frequency-spread first pilot signal, and wherein said demodulation means includes: local oscillation means for generating a local signal of a fixed frequency; second phase modulation means for phase modulating said local signal with said pseudo noise signal; mixer means for frequency mixing said modulated local signal and a signal from said fourth path to demodulate said first pilot signal for output; and phase adjustment means for adjusting the relative phase of said pseudo noise signal to be provided to said first and second phase modulation means.

22. The feed-forward amplifier of claim 19, wherein said frequency spread means includes: pseudo noise signal generating means for generating a pseudo noise signal; and first frequency synthesizer means which has its oscillation frequency controlled by said pseudo noise signal to output said frequency-spread first pilot signal, and wherein said demodulation means includes: second frequency synthesizer means which has its oscillation frequency controlled by said pseudo noise signal to generate a frequency-spread local signal; mixer means for frequency mixing said frequency-spread local signal and a signal from said fourth path to obtain a signal of a frequency equal to the frequency difference between them; phase adjustment means for adjusting the relative phase of said pseudo noise signal to be provided to said first and second frequency synthesizers; and a level detector for detecting the level of the output of said mixer:

23. The feed-forward amplifier of claim 19, 21, or 22, wherein said pilot signal injection means includes: first and second directional couplers inserted in said signal input path and said first path, respectively; and a first changeover switch for selectively applying therethrough said frequency-spread first pilot signal as said first or second pilot signal to said first or second directional coupler, and wherein said level detection means includes: third and fourth directional couplers inserted in said fourth path and said signal output path, respectively; and a second changeover switch for selectively applying therethrough the outputs of said third and fourth directional couplers to said demodulation means.

24. The feed-forward amplifier of claim 1, 2, 4, 5, 19, 21, or 22, wherein said pilot injection means includes: a directional coupler connected to an internal circuit of said main amplification means; and a pilot signal generator for generating said second pilot signal for injection into said internal circuit of said main amplification means via said directional coupler.

25. The feed-forward amplifier of claim 24, wherein said main amplification means includes a cascade connection of at least two amplification elements, said directional coupler being connected in series between said two amplification elements.

26. The feed-forward amplifier of claim 24, wherein said main amplification means includes a parallel connection of a plurality of amplification elements between power divider means and power combiner means, said directional coupler being connected to one of said plurality of amplification elements.

27. A linear amplifier assembly comprising: a plurality of said feed-forward amplifiers, each defined by claim 21 or 22, power divider means for dividing an input signal to inputs of said feed-forward amplifiers; and power combiner means for combining the outputs of said feed-forward amplifiers; wherein said pseudo noise signal generating means of each of said feed-forward amplifiers generates said pseudo noise signal, based on a different initial value of a random code string.

28. The feed-forward amplifier of claim 1, 2, 4, or 5, wherein said level detection means comprises selective level meter means.

29. The feed-forward amplifier of claim 1, 2, 4, or 5, wherein said level detection means comprises holodyne detection means wherein said first and second pilot signals supplied thereto as local signals from said pilot signal injection means are frequency mixed with signals from said fourth path and said signal output path to detect the components of said first and second pilot signals on said fourth path and said signal output path.

30. The feed-forward amplifier of claim 1, 2, 4, or 5, wherein said level detection means includes: a common level detector for detecting signal levels; and a changeover switch for selectively applying said first and second pilot signals from said fourth path and said signal output path to said common level detector.

31. A feed-forward amplifier comprising:
power divider means whereby the power of an input signal provided to a signal input path is divided to first and second paths;
main amplification means inserted in said first path, for amplifying said input signal:
electrically variable first attenuation means for adjusting the relative levels of signals on said first and second paths;
electrically variable first phase shift means for adjusting the relative phases of signals on said first and second paths;
power combiner/divider means for combining the output power of said first and second paths and for dividing said combined power to third and fourth paths;
electrically variable second attenuation means for adjusting the relative levels of signals on said third and fourth paths;
electrically variable second phase shift means for adjusting the relative phases of signals on said third and fourth paths;
auxiliary amplification means inserted in said fourth path;
power combiner means for combining the outputs of said third and fourth paths and for providing said combined output to a signal output path;
control means or controlling said first and second variable attenuation means and said first and second variable phase shift means;
first pilot signal injection means for injecting a first pilot signal into said signal input path;
second pilot signal injection means for injecting a second pilot signal into an internal circuit of said main amplification means;
first level detection means for detecting the level of said first pilot signal on said fourth path; and
second level detection means for detecting the level of said second pilot signal on said signal output path;
said control means being operative to adjust said first variable attenuation means and said first variable phase shift means in a manner to minimize the level of said first pilot signal to be detected by said first level detection means and being operative to adjust said second variable attenuation means and said second variable phase shift means in a manner to minimize the level of said second pilot signal to be detected by said second level detection means.

32. The feed-forward amplifier of claim 31, wherein said main amplification means includes a direction coupler connected to said internal circuit, and said second pilot signal from said second pilot signal injection means is injected via said directional coupler into said internal circuit of said main amplification means.

33. The feed-forward amplifier of claim 32, wherein said main amplification means includes a cascade connection of at least two amplification elements and said directional coupler is connected in series between said at least two amplification elements.

34. The feed-forward amplifier of claim 32 or 33, wherein said main amplification means including said directional coupler is formed as an integrated module.

* * * * *